(12) United States Patent
Minami et al.

(10) Patent No.: US 6,840,732 B2
(45) Date of Patent: Jan. 11, 2005

(54) TRANSPORT APPARATUS AND VACUUM PROCESSING SYSTEM USING THE SAME

(75) Inventors: Hirofumi Minami, Kanagawa (JP); Junpei Yuyama, Kanagawa (JP)

(73) Assignee: ULVAC, Inc., Chigasaki (JP)

( * ) Notice: Subject to any disclaimer, the term of this patent is extended or adjusted under 35 U.S.C. 154(b) by 17 days.

(21) Appl. No.: 09/983,140

(22) Filed: Oct. 23, 2001

(65) Prior Publication Data

US 2002/0048502 A1 Apr. 25, 2002

(30) Foreign Application Priority Data

| Oct. 24, 2000 | (JP) | 2000-323965 |
| Feb. 6, 2001 | (JP) | 2001-028954 |
| Jun. 15, 2001 | (JP) | 2001-181441 |
| Jun. 15, 2001 | (JP) | 2001-181775 |

(51) Int. Cl.$^7$ ................................ B65G 49/07
(52) U.S. Cl. ............... 414/744.5; 414/917; 414/939; 901/15; 901/21
(58) Field of Search ............... 414/744.5, 939, 414/917; 901/21, 15, 28; 74/490.04

(56) References Cited

U.S. PATENT DOCUMENTS

| 5,147,175 A | * | 9/1992 | Tada ................ 414/744.5 |
| 5,180,276 A | * | 1/1993 | Hendrickson ......... 414/752.1 |
| 5,333,986 A | * | 8/1994 | Mizukami et al. ...... 414/217 |
| 5,431,529 A | * | 7/1995 | Eastman et al. ....... 414/744.5 |
| 5,725,352 A | * | 3/1998 | Tanaka ............... 414/744.5 |
| 5,743,704 A | * | 4/1998 | Caveney et al. ....... 414/744.5 |
| 6,057,662 A | * | 5/2000 | McAndrew et al. ..... 318/567 |
| 6,077,027 A | * | 6/2000 | Kawamura et al. ..... 414/744.5 |
| 6,189,404 B1 | * | 2/2001 | Hatake et al. ........ 74/490.03 |
| 6,450,757 B1 | * | 9/2002 | Saeki et al. .......... 414/744.5 |
| 6,464,448 B1 | * | 10/2002 | Ha ................... 414/744.5 |
| 6,558,107 B1 | * | 5/2003 | Okuno ............... 414/744.5 |

FOREIGN PATENT DOCUMENTS

| JP | 4-279043 | 10/1992 |
| JP | 9-283588 | 10/1997 |
| JP | 2733799 | 1/1998 |
| JP | 2808826 | 7/1998 |

* cited by examiner

Primary Examiner—James W. Keenan
(74) Attorney, Agent, or Firm—Armstrong, Kratz, Quintos, Hanson & Brooks, LLP.

(57) ABSTRACT

This invention provides a transport apparatus having a simple configuration that can reduce its turning radius and transport semiconductor devices at high speed. The transport apparatus comprising the first and second arms having at a first end of each thereof a rotary drive shaft being arranged coaxially, and third and fourth arms rotatably linked at respective the first ends thereof to the respective second ends of the first and second arms. The second ends of the third and fourth arms are supported around centers of coaxially arranged spindles, respectively. The transport apparatus further comprises an articulating mechanism having an attitude control mechanism adapted to apply rotary forces with opposite phases to the respective spindles arranged at the third and fourth arms.

6 Claims, 16 Drawing Sheets

TRANSPORT APPARATUS AND VACUUM PROCESSING SYSTEM USING THE SAME

BACKGROUND OF THE INVENTION

1. Field of the Invention

The present invention relates to a transport apparatus for bringing a semiconductor substrate or the like into a vacuum processing chamber and carrying it out from the chamber to a predetermined position.

2. Description of the Related Art

In recent years, there has been a strong demand for precision semiconductor devices with critical dimensions. Systems for manufacturing such semiconductor devices are then required to improve the throughput and reduce the foot print necessary for installing the system.

In view of these requirements, there have been proposed multi-chamber systems and transport apparatuses comprising a transport chamber arranged at the center and a plurality of processing chambers arranged around the transport chamber and connected thereto by way of respective gate valves so that various processing operations may be conducted in vacuum atmosphere in a coordinated manner (see the publications of Japanese Patent Nos. 2733799 and 2808826).

FIG. 16 of the accompanying drawings is a schematic plan view of such a known transport apparatus (as disclosed in Japanese Patent Laid-Open Publication No. Hei. 4-279043), illustrating a principal part thereof.

Referring to FIG. 16, in the transport apparatus 100, the rotary force generated by a drive source (not shown) is transmitted to a drive shaft 101, to a drive gear 102 secured to the drive shaft 101 and then to a driven shaft 104 by way of driven gear 103 engaged with the drive gear 102.

A first arm 105 is fitted to the drive shaft 101 and a third arm 107 is linked to the end of the first arm 105 so as to be rotatable around its rotary shaft 106.

On the other hand, a second arm 108 is fitted to the driven shaft 104 and a fourth arm 110 is linked to the end of the second arm 108 so as to be rotatable around its rotary shaft 109.

A movable pulley 111 is fitted to the third arm 107 so as to be rotatable coaxially around the rotary shaft 106. The movable pulley 111 is linked to a fixed pulley 112 that is fixed coaxially with the driven shaft 101 by way of a belt 113. The diameter of the movable pulley 111 and that of the fixed pulley 112 show a ratio of 1:2.

Mating gears 116, 114 are rotatably fitted to the respective ends of the third and fourth+arms 107 and 110. The mating gears 116, 114 are engaged with each other and fitted to a substrate holder 115.

With the known transport apparatus 100 having the above described link mechanism, as the drive shaft 101 is driven to rotate, the substrate holder 115 is moved along a straight line 1 rectangularly intersecting the straight line connecting the center of the drive shaft 101 and that of the driven shaft 104 (to be referred to as "transport line" hereinafter) in a horizontal plane and passes through a position where the first arm 105 and the second arm 108 form an angle of 180° (to be referred to as "dead point" hereinafter).

In the transport apparatus 100, the drive shaft 101 and the driven shaft 104 are rotatably fitted to a support (not shown) in such a way that the substrate holder 115 is driven to rotate around the drive shaft 101 by another drive source (not shown).

With the above described known transport apparatus 100, however, since the substrate holder 115 is driven to rotate around the drive shaft 101, it does not rotate around the center of the arms that is the intersection O of the straight line m connecting the center of the drive shaft 101 and that of the driven shaft 104 and the transport line 1 when the first through fourth arms 105, 107, 108 and 110 are folded to the dead point.

This means that, with the above described known transport apparatus 100, it is difficult to reduce the minimum turning radius and hence the inner diameter of the transport chamber. Then, by turn, it is difficult to dimensionally reduce the entire semiconductor manufacturing system.

While the throughput of a semiconductor manufacturing system can be improved effectively by increasing the operating speed of the transport apparatus thereof, the operating torque of the drive source cannot be raised to increase the operating speed of the transport apparatus when both the drive shaft 101 and the driven shaft 104 are operated by means of a single drive source as in the case of the above described known transport apparatus. This problem is due to transmission loss of rotary force.

These problems may be solved by using first and second drive shafts that are arranged coaxially and driven independently by respective drive sources. Then, however since the mating gears 114, 116 that constitute an articulating mechanism are juxtaposed, the angle of rotation of the third arm 107 relative to the first arm 105 and that of the fourth arm 110 relative to the second arm 108 are not proportional to the angle of rotation of the first arm 105 and that of the second arm 108 respectively. Therefore, the rotary motion of the third arm 107 and that of the fourth arm 110 are not synchronized with the rotary motions of the first and second arms 105, 108 to make it difficult to move the substrate holder 115.

While these problems may be avoided by providing a complex correction mechanism, such a mechanism inevitable raise the number of components and that of assembling steps.

FIG. 17 of the accompanying drawings is a schematic plan view of another known transport apparatus (as disclosed in Japanese Patent Laid-Open Publication No. Hei. 9-283588), illustrating a principal part thereof.

Referring to FIG. 17, with this known transport apparatus 200, the rotary forces generated independently by a pair of drive sources (not shown) are transmitted respectively to a first drive shaft 201 and a second drive shaft 202 that are arranged coaxially.

A first arm 203 is fixed to the first drive shaft 201 and a third arm 205 is linked to the end of the first arm 203 so as to be rotatable around its rotary shaft 207.

On the other hand, a second arm 204 is fixed to the second drive shaft 202 and a fourth arm 206 is linked to the end of the second arm 204 so as to be rotatable around its rotary shaft 208. The length of the second arm 204 and that of the fourth arm 206 are made equal to those of the first and third arms 203 and 205, respectively.

A first pulley 209 is fixed to the third arm 205 so as to be rotatable around the rotary shaft 207 coaxially. A second pulley 210 is coaxially fixed to the second drive shaft 202. An endless drive belt 211 is wound around the first pulley 209 and the second pulley 210. A dead point escape mechanism 212 is formed by the first and second pulleys 209, 220 and the drive belt 211.

A first mating pulley 215 is fixed to the end of the third arm 205 and a second mating pulley 216 having a diameter same as that of the first mating pulley 215 is fitted to the end of the fourth arm 206. The first and second mating pulleys 215, 216 are rotatably fitted to a substrate holder 217 by way of respective rotary pins 219, 220. A restraint belt 221 is wound around the restraint pulleys 215, 216 to substantially form a FIG. "8". The first and second mating pulleys 215, 216 and the restraint belt 221 form an attitude control mechanism 222.

With this known transport apparatus 200 having the above described link mechanism, the substrate holder 217 is driven to move straight by rotating the first drive shaft 201 and the second drive shaft 202 reversely relative to each other on the transport line 222 passing through the bisector of the angle between the third arm 205 and the fourth arm 206 running through the center of the first drive shaft 201 and the second drive shaft 202, the angle being restraint by the restraint belt 221.

With this known transport apparatus 200, if the first arm 203 and the second arm 204 are located on dead line 223 where the angle between the first arm 203 and the second arm 204 becomes equal to 180°, the rotary force of the second drive shaft 202 is transmitted to the third arm 205 by way of the drive belt 211 and the first pulley 209 to cause the substrate holder 217 to pass through the dead line 223.

Additionally, with this known transport apparatus 200, since the fourth arm 206 is linked to the second arm 204 by means of a pin (whereas the third arm 205 is not only linked to the first arm 203 by means of a pin but also restrained by the second drive shaft 202 by way of the first pulley 209, the drive belt 211 and the second pulley 210). the first pulley 209 and the third arm 205 try to rotate relative to the first arm 203 by an angle of 2 θ (that is, twice the rotary angle θ of the second arm 204) when the first drive shaft 201 and the second drive shaft 202 are driven to rotate in opposite senses by an angle of θ.

On the other hand, since the two mating pulleys 215, 216 of the attitude control mechanism 222 are juxtaposed, the angle of rotation of the third arm 205 relative to the first arm 203 and that of the fourth arm 206 relative to the second arm 204 are not proportional to the angle of rotation θ of the first and second arms 203 and 204. In other words, since the angle of rotation of the mating pulley 215 is equal to that of the mating pulley 216, the former angles of rotation are not equal to twice of the angle θ and the constant of proportionality can fluctuate around 2 depending on the latter angles of rotation. Because of the discrepancy that can arise to the angle of rotation of the third arm due to the different mechanism, the substrate holder 217 may not be held uniformly relative to the transport line 222; thereby, deteriorating the straightness of the movement. Additionally, the substrate holder 217 may have difficulty in moving.

It is known to divide the drive belt 211 and arrange tension coil springs between them in order to avoid the above identified problems. It is also known to provide a tension regulating mechanism for suppressing the expansion/contraction of the drive belt 211 by arranging a plurality of tension pulleys between the first pulley 209 and the second pulley 210.

However, even the known transport apparatus 200 is provided with such a known tension regulating mechanism, the first pulley 209 and the second pulley 210 can show a phase difference because of the difference in the elongation due to heat of the drive belt 211 and the first arm 203 so that the dead point escape mechanism 212 can still adversely affect the linear movement of substrates. This problem is particularly remarkable when the arms of the link mechanism and the drive belt 211 are made long in order to increase the distance for transporting substrates. Additionally, the tension regulating mechanism involves a problem of requiring a long and cumbersome operation for assembling it and regulating the tension.

It is also known to provide a mechanism designed to equalize the angle or rotation of the fourth arm 206 relative to the second arm 204 and that of the third arm 205 relative to the first arm 203 by using a cam-shaped pulley for the first pulley 209 or the second pulley 210 and restricting the rotary motion of the third arm 205 in order to ensure a linear movement of the known transport apparatus 200.

However, if such a cam-shaped pulley is used for the transport apparatus 200, the process of preparing the cam-shaped pulley becomes a cumbersome one and requires an increased number of parts to consequently raise the cost of the mechanism and hence that of the semiconductor manufacturing system including the transport apparatus 200.

While it may be conceivable to provide a mechanism for adjusting the length of the first arm 203, again the process of preparing such a mechanism is cumbersome and requires an increased number of parts to consequently raise the cost of the mechanism as in the case of the tension regulating mechanism and the pulley mechanism, which are described above.

SUMMARY OF THE INVENTION

Thus, it is an object of the present invention to provide a transport apparatus having a simple configuration that involves a small turning radius and provides a high transport speed.

Another object of the invention is to provide a transport apparatus that can ensure a linear movement of substrates by eliminating the adverse effects of the dead point escape mechanism on the attitude control mechanism without raising the number of parts and entailing a cumbersome assembly and adjustment process.

With the transport apparatus as provided in the first embodiment of this invention, since drive shaft of the first arm and that of the second arm are arranged coaxially, the minimum turning radius can be reduced than ever in a state where the first through fourth arms are arranged at the dead point.

Additionally, with the transport apparatus as provided in the first embodiment of this invention, since the opposite ends of the third and fourth arms are linked to the respective spindles that are arranged also coaxially, the drive shafts of the third and fourth arms can be driven to rotate without requiring a complex correction mechanism for changing the arm length so that the first through fourth arms can be operated at high speed although the transport apparatus has a simple configuration.

Furthermore, with the transport apparatus as provided in the first embodiment of this invention, the spindles of the third and fourth arms are driven to rotate with opposite phases so that substrates can be moved linearly along the predetermined transport line without entailing problems including the problem of unintended rotation of the carrier fitted to the articulating mechanism and the carrier can be moved smoothly at and near the dead point.

The unintended revolution of the carrier can be completely prevented from taking place when the rotary forces applied respectively to the spindles of the third and fourth arms with opposite phases are made equal in the first embodiment of this invention.

The overall configuration of the transport apparatus as provided in the first embodiment of this invention can be further simplified when the attitude control mechanism is provided with a power transmission mechanism for transmitting rotary forces respectively to the spindles of the third and fourth arms with opposite phases.

The articulating mechanism of the transport apparatus as provided in the first embodiment of this invention can be made thin and lightweight when the above-mentioned attitude control mechanism comprises pulleys and belts as defined above because the attitude control mechanism can then be made to have a low profile and a small weight.

When the attitude control mechanism of the transport apparatus as provided in the first embodiment of this invention comprises first and second restraint pulleys fixed respectively to the spindles of the third and fourth arms, a third restraint pulley juxtaposed with the first and second restraint pulleys, a first restraint belt arranged so as to drive either the first restraint pulley or the second restraint pulley and the third restraint pulley to rotate in phase, and a second restraint belt arranged so as to drive either the first restraint pulley or the second restraint pulley and the third restraint pulley to rotate with opposite phases, it is possible to reliably transmit rotary forces respectively to the spindles of the third and fourth arms with opposite phases, although the transport apparatus has a simple configuration.

When the attitude control mechanism of the transport apparatus as provided in the first embodiment of this invention comprises sprockets and chains as defined above, it is made free from slippery motions and affected minimally by thermal expansions.

When the attitude control mechanism of the transport apparatus as provided in the first embodiment of this invention comprises gears as defined above, the transport apparatus can be assembled and regulated in a simple way without requiring the need of regulating tension unlike the case of using belts.

When the transport apparatus as provided in the first embodiment of this invention is equipped with an additional power transmission mechanism comprising a drive pulley fixed to the drive shaft of the first or second arm, a it driven pulley secured to an end of the spindle of the third or fourth arm, and a belt wound around the drive pulley and the driven pulley, the power of the drive source is efficiently transmitted to each of the arms by way of the additional power transmission mechanism so that the transport apparatus can be operated more smoothly at high speed.

As described above, in the first embodiment of this invention, it is possible to provide a compact vacuum processing system that can transport objects to be processed at high speed.

On the other hand, with the transport apparatus as provided in the second embodiment of this invention, a pair of spindles for coaxially and respectively supporting a pair of driven arms at respective ends thereof and a rotary member of the attitude control mechanism are arranged with a predetermined positional relationship on the substrate holder for holding predetermined substrates and a second link mechanism is formed by adding a separate link member as dead point escape mechanism in order to allow the substrate holder to escape the dead point of the first parallel link mechanism. Thus, the rotary motions of the paired driven arms are synchronized by the rotary member of the attitude control mechanism to eliminate any relative displacement of the phases of the driven arms. Additionally, the expansion/contraction that can arise in the second link mechanism due to external force and/or heat can be equalized with the expansion/contraction that arises in the first link mechanism in an easy way of making the link members from the same material of the first link members if compared with the prior art so that any displacement of the phase of each of the paired driven arms relative to that of the corresponding one of the paired drive arms can be eliminated.

As a result, with the transport apparatus as provided in the second embodiment of this invention, the substrate holder can be made to reliably move straight because the attitude control mechanism can operate properly, eliminating any adverse effects that the dead point escape mechanism can otherwise exert on the first parallel link mechanism.

With the transport apparatus as provided in the second embodiment of this invention, when all the inter-joint distances of the paired drive arms and the paired driven arms of the first link mechanism are made equal to each other and the inter-joint distance of the link members of the second link mechanism is made equal to that of the first link mechanism, while the link member of the second link mechanism is made to run in parallel with one of the paired drive arms, the pairs of driven arms can be made to rotate by a same angle of rotation relative to the paired drive arms. In addition, the expansion/contraction that can arise in link member of the second link mechanism due to heat can be equalized with the expansion/contraction that arises in the paired drive arms and the paired driven arms of the first link mechanism by selecting a parallel link mechanism for both the first link mechanism and the second link mechanism. This can ensure a stable linear movement of the substrate holder.

With the transport apparatus as provided in the second embodiment of this invention, when the second link mechanism is formed by using the link member, one of the drive arms, and one of the driven arms, the dead point escape mechanism can be realized simply by adding the link member. Therefore, the use of members including pulleys for the dead point escape mechanism and the provision of a mechanism for regulating the dead point escape mechanism of the prior art are no longer necessary. Then, the transport apparatus can be realized with a reduced number of components and hence can be assembled in a simple manner so that the use of a complex regulation procedure is no longer necessary to reduce the cost of the entire semiconductor manufacturing system including the transport apparatus.

With the transport apparatus as provided in the second embodiment of this invention, when the arm section of the link member of the second link mechanism has a length between $1/5$ and $1/3$ of the length of the paired drive arms of the first link mechanism and shows an angle of inclination between 20° and 40°, the first link mechanism and the second link mechanism does not come to the dead point simultaneously so that the first link mechanism can smoothly and advantageously pass through the dead point.

Finally, with the transport apparatus as provided in the second embodiment of this invention, when the substrate holder comprises a plurality of holding sections and the attitude control mechanism is arranged at a position where the rotary member is separated from these holding sections by a same and identical distance, the rotary member and the power transmission members by which the rotary member is fitted to the paired driven arms will expand/contract by a same amount due to heat if the holding members of the substrate holder are made to carry respective heated substrates because they are evenly heated by the substrates. Then, the substrate holder can accurately move straight.

As described above, in the second embodiment of this invention, it is possible to provide a vacuum processing system that can accurately move straight.

DETAILED DESCRIPTION OF THE PREFERRED EMBODIMENTS

Preferred embodiments of the present invention will be described in detail below with reference to the accompanying drawings.

Figure 1:
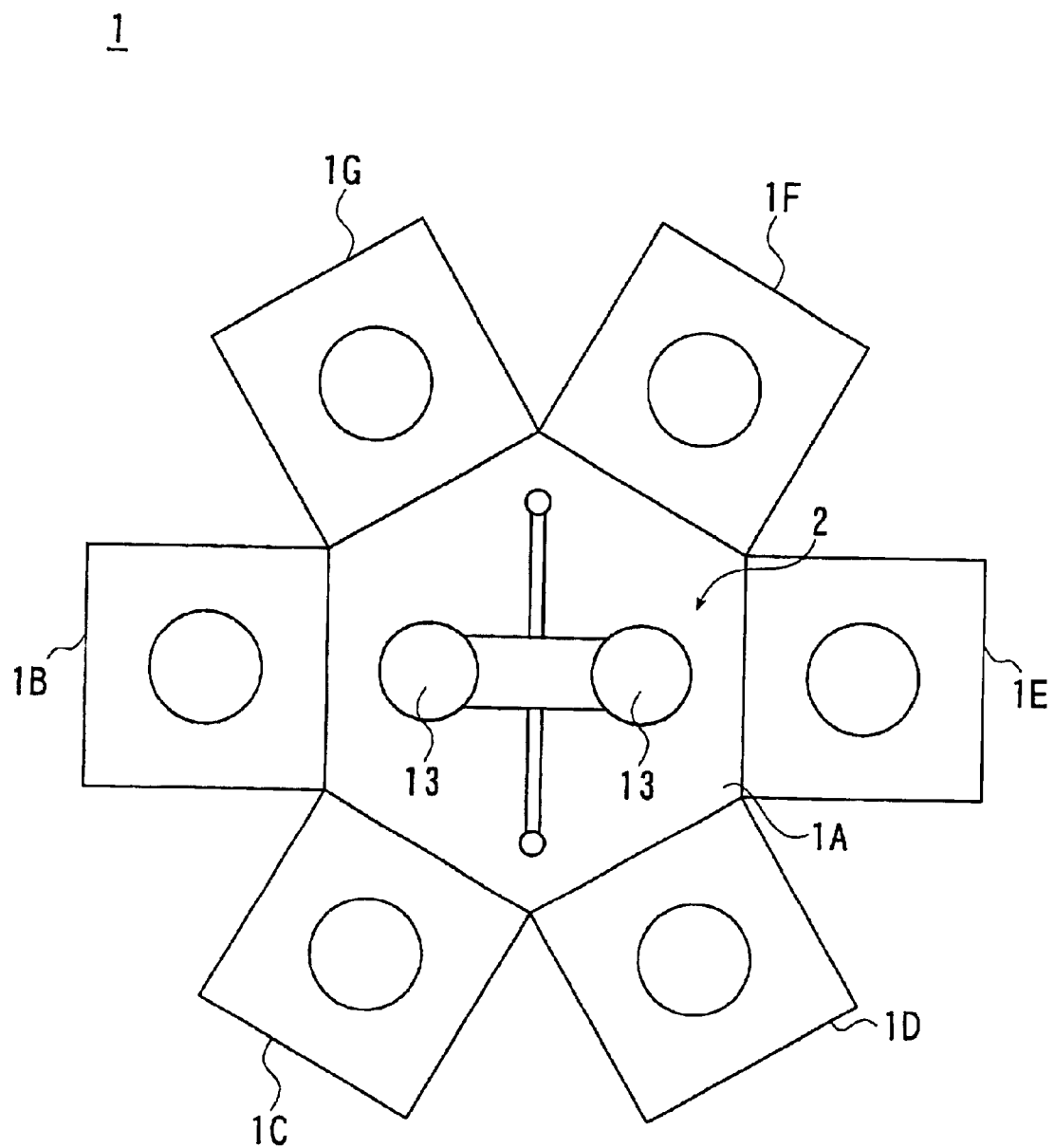
FIG. 1 is a schematic illustration of a vacuum processing system according to the present invention.

FIG. 1 shows a schematic illustration of a vacuum processing system according to the present invention.

The vacuum processing system 1 has a transport chamber 1A arranged at the center, and has a loading/unloading chamber 1B and first to fifth processing chambers 1C–1G arranged around the transport chamber 1A. The transport chamber 1A, loading/unloading chamber 1B, and first to fifth processing chambers 1C–1G are hermetically sealed and connected. Further, they can keep their vacuum atmospher separately.

In the conveying chamber 1A, a transport apparatus 2 according to the present invention is installed to bring a semiconductor wafer 13 into the loading/unloading chamber 1B and the first to fifth processing chambers 1C–1G and carrying it out from the chambers freely.

Figure 2:
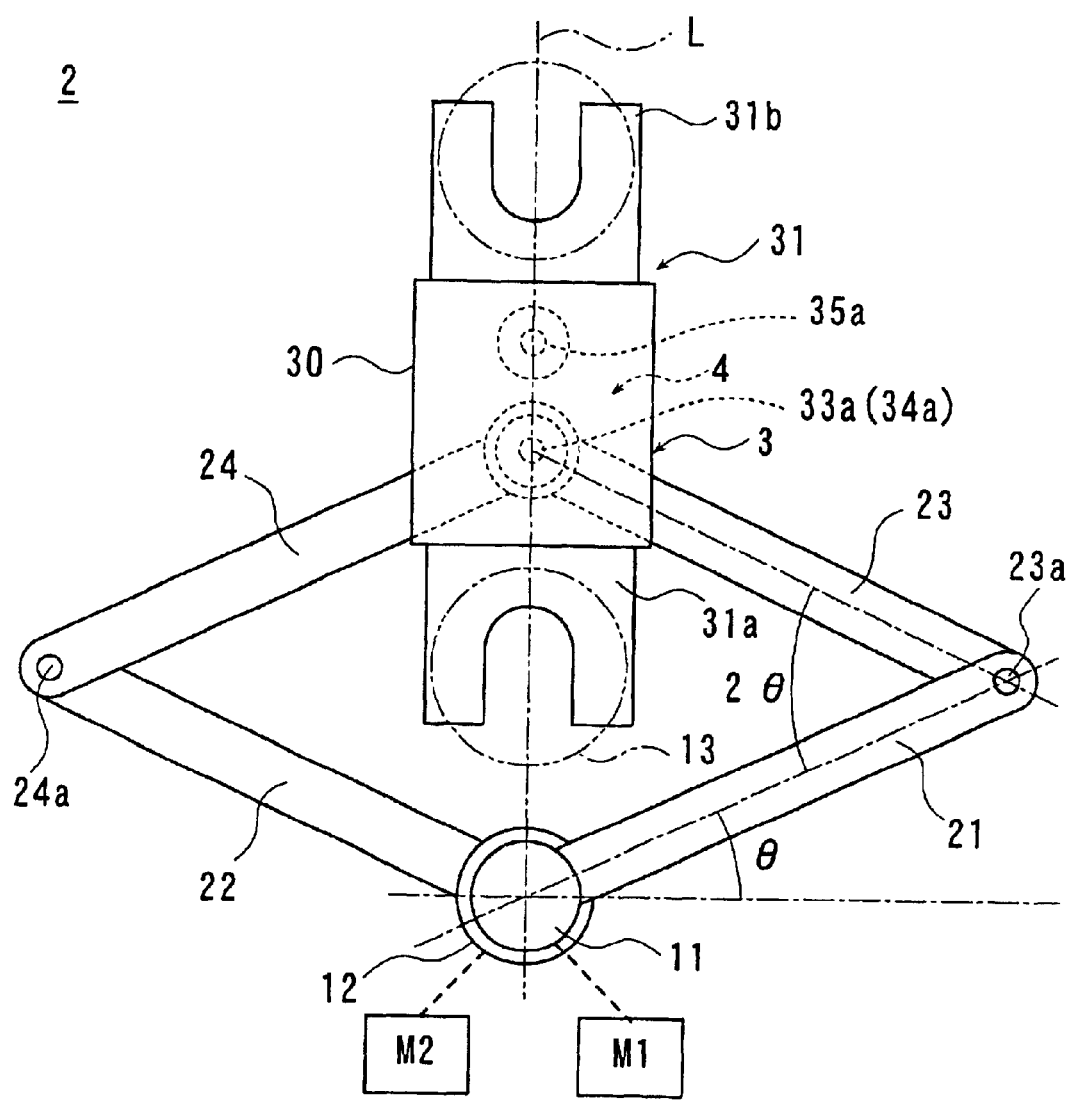
FIG. 2 is a plan view of an embodiment of a transport apparatus according to the first embodiment of this invention, illustrating its configuration.

FIG. 2 is a plan view illustrating the configuration of an embodiment of the transport apparatus according to the first embodiment of this invention.

Referring to FIG. 2, the transport apparatus 2 according to the present embodiment has first and second drive shafts 11, 12 which are arranged coaxially. Independent first and second driving sources M1, M2 transmit rotary forces in the clockwise and counterclockwise directions to these drive shafts 11, 12, respectively, to rotate the first and second drive shafts 11, 12.

A first arm 21 is fixed to the first drive shaft 11, while a second arm 22 is fixed to the second drive shaft 12.

At the ends of the first and second arms 21, 22, third and fourth arms 23, 24 are mounted with bearings(not shown), for example, so that they can smoothly rotate around spindles 23a, 24a, respectively.

The ends of these third and fourth arms 23, 24 are connected to an articulating mechanism 3 that has an attitude control mechanism to be described later.

In the present embodiment, all the first to fourth arms 21–24 have the same length (distance between rotation axes). Hereafter, the first-fourth arms 21–24 are referred to as an arm 20 as necessary.

Figure 3A:
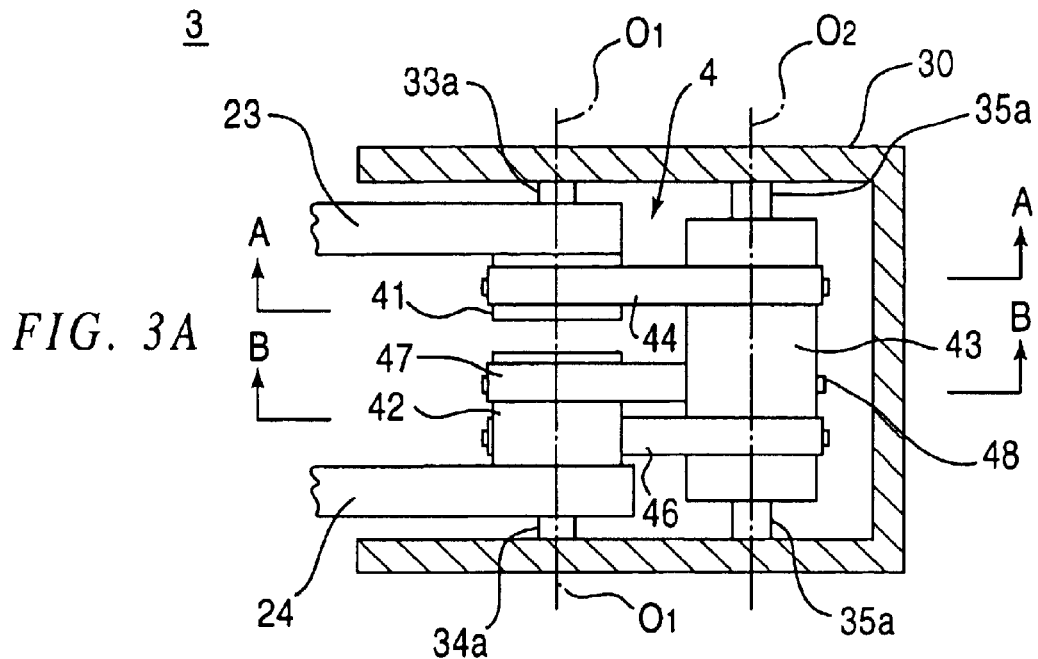
FIG. 3A is a cross sectional side view of an attitude control mechanism of an articulating mechanism of the embodiment of FIG. 2.
Figure 3B:
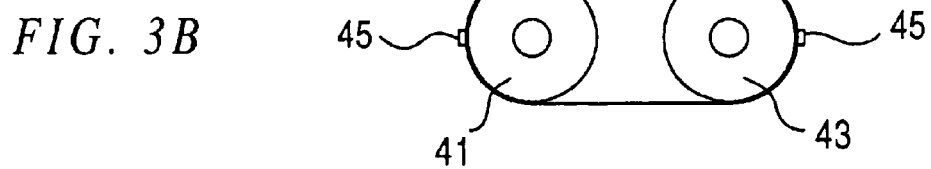
FIG. 3B is a cross sectional view taken along line A—A in FIG. 3A.
Figure 3C:
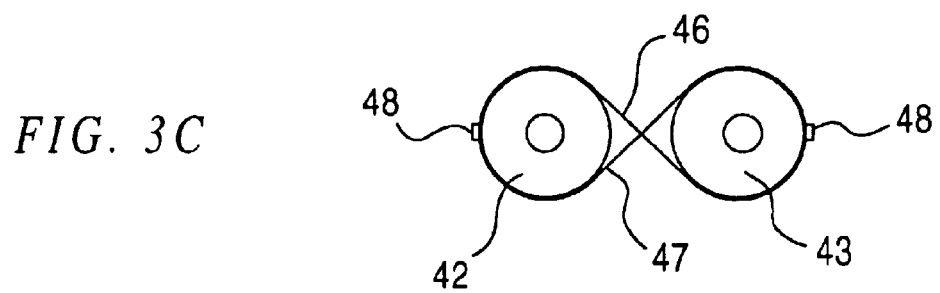
FIG. 3C is a cross sectional view taken along line B—B in FIG. 3A.

FIG. 3A is a side sectional view of the attitude control mechanism of the articulating mechanism according to the present embodiment; FIG. 3B is a sectional view taken along the A—A line in FIG. 3A; and FIG. 3C is a sectional view taken along the B—B line in FIG. 3A.

As shown in FIG. 2 and FIG. 3A, the articulating mechanism 3 has a holder 30 and this holder 30 has a carrier 31 on which a semiconductor wafer 13 is mounted.

In the present embodiment, a first carrier 31a is attached to the holder 30 on the side of the first and second drive shafts 11, 12, while a second carrier 31b is symmetrically attached to the opposite side of the holder 30. In this way, the transport apparatus can carry two semiconductor wafers 13 at a same time.

In the present embodiment, the holder 30 of the articulating mechanism 3 includes an attitude control mechanism 4 that is described below.

Referring to FIG. 3A, this attitude control mechanism 4 has first to third cylindrical restraint pulleys 41, 42 and 43.

The first restraint pulley 41 is fixed to the end of the third arm 23 on the side opposite to the side where the first arm 21 is connected. This pulley rotates around a spindle 33a mounted on, for example, the upper part of the holder 30. This first restraint pulley 41 allows the third arm 23 to rotate in parallel to the plane including a transport line L, which will be described later.

Meanwhile, the second restraint pulley 42 is fixed to the end of the fourth arm 24 on the side opposite to the side where the second arm 22 is connected. This pulley rotates around a spindle 34a mounted on, for example, the lower part of the holder 30. This second restraint pulley 42 allows the fourth arm 24 to rotate in parallel to the plane including the transport line, L.

These first and second restraint pulleys 41, 42 are arranged coaxially sharing the same rotary axis $O_1$.

The third restraint pulley 43 is configured to rotate around a spindle 35a in the holder 30, away at a predetermined distance from the first and second restraint pulleys 41, 42.

The rotary axis $O_2$ of the third restraint pulley 43 is configured to be parallel with the rotary axis $O_1$ of the first and second pulleys 41, 42.

The first to third restraint pulleys 41, 42, and 43 have the same diameter.

Referring to FIGS. 3A and 3B, a restraint belt 44 is wound around the first restraint pulley 41 and the third restraint pulley 43. The restraint belt 44 is fixed on the first and third restraint pulleys 41, 43 by a, e.g., fastening screw 45. The above configuration makes the first restraint pulley 41 and the third restraint pulley 43 rotate synchronously in phase.

On the other hand, as shown in FIGS. 3A and 3C, a pair of restraint belts 46, 47 are looped across the second pulley 42 and the third pulley 43 so as to substantially form a letter of "8". These restraint belts 46, 47 are fixed on the second and third restraint pulleys 42, 43 by a fastening screw 48, for example. This configuration makes the second restraint pulley 42 and the third restraint pulley 43 rotate synchronously with opposite phases. The first through third pulleys 41, 42, 43 may be sprockets, while the belts 44, 46 may be chains.

In the present embodiment of such a configuration, when the third arm 23 is rotated by an angle θ in the given direction, the rotary force is transmitted via the first restraint pulley 41 and the restraint belt 44 keeping the same phase to the third restraint pulley 43, while the rotary force of the third restraint pulley 43 is transmitted via the restraint belts 46, 47 with the opposite phase to the second restraint pulley 42. As a result, the fourth arm 24 fixed to the second restraint pulley 42 rotates in the direction opposite to the third arm 23 by an angle θ.

The operation mechanism of the present embodiment is now explained below.

When the first drive shaft 11 and the second drive shaft 12 are rotated by a predetermined angle θ in the opposite direction so that the angle made by the first arm 21 and the second arm 22 decreases from 180 degrees, which is the angle made at the dead point, the first arm 21 and the second arm 22 rotate by the same angle θ in the opposite direction.

In this case, since the first to fourth arms 21–24 form a link mechanism and the first to fourth arms 21–24 have the same length, the third arm 23 rotates the predetermined angle θ around the spindle 33a of the first restraint pulley 41, while the fourth arm 24 rotates in the opposite direction by the angle θ around the spindle 34a of the second restraint pulley 42.

As a result, the spindles 33a, 34a of the first and second restraint pulleys 41, 42 move on a line L (hereafter, transport line), that connects the center of the first and second drive shafts 11, 12 and the center of the spindles 33a, 34a (see FIG. 2).

In this case, since the third arm 23 and the fourth arm 24 have rotated with opposite phases by the same angle θ, the holder 30 of the articulating mechanism 3 does not rotate around the supporting shafts 33a, 34a. Therefore, the carrier 31 attached to the holder 30 moves straight on transport line L.

Meanwhile, in order to return the carrier 31 to the original position, the first drive shaft 11 and the second drive shaft 12 are rotated in the direction opposite to that described above by the predetermined angle θ. Then, the operation (reverse to the above operation) is performed; and the first and second arms 21, 22 return to the dead point.

On the other hand, when the first drive shaft 11 and the second drive shaft 12 are rotated in the same direction, the carrier 31 rotates in the same direction around the first drive shaft 11 and the second drive shaft 12.

The description that follows is the explanation of the carrier 31 passing the dead point in the present embodiment.

This embodiment assumes a situation in which the angle formed by the first arm 21 and the second arm 22 becomes a little smaller than 180 degrees which is the angle formed at the dead point.

In this situation, the first drive shaft 11 is rotated by an angle θ in a given direction and the second drive shaft 12 is rotated by the same angle θ in the opposite direction to increase the angle formed by the first arm 21 and the second arm 22.

At this time, the third arm 23 and the fourth arm 24 are provided with rotary forces in opposite direction to each other. In addition, the rotation angle of the third arm 23 relative to the first arm 21 and the rotation angle of the fourth arm 24 relative to the second arm 22 are twice as large as the rotation angle of the first arm 21 and the rotation angle of the second arm 22, respectively. Therefore, the third arm 23 and the fourth arm 24 rotate against the first arm 21 and the second arm 22, and then the carrier 31 smoothly passes the dead point.

FIGS. 4A–4D and FIGS. 5A–5C are diagrams illustrating the operation of replacing a treated semiconductor wafer by a untreated semiconductor wafer in the vacuum processing chamber according to the embodiment of the invention.

Figure 4A:
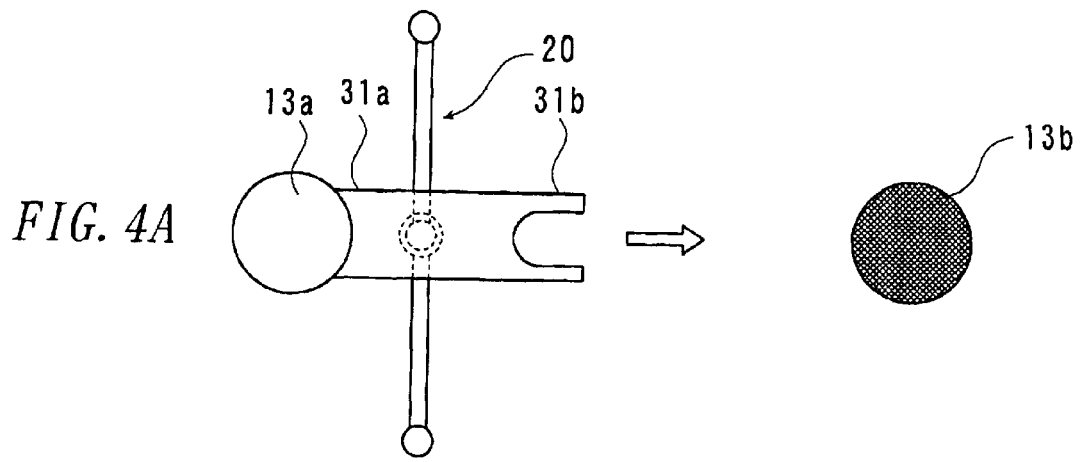
FIGS. 4A through 4D are schematic illustrations of an operation of replacing a treated semiconductor wafer with an untreated semiconductor wafer in a vacuum processing vessel by using the embodiment of FIG. 2 (Part 1).

FIG. 4A shows a situation in which an untreated semiconductor wafer 13a is mounted on the first carrier 31a and no semiconductor wafer is on the second carrier 31b.

First, the first to fourth arms 21–24 being located at the dead point, are rotated, and the second carrier 31b is directed to the treated semiconductor wafer 13b that has been placed in a predetermined position in the vacuum processing chamber (not shown).

Figure 4B:
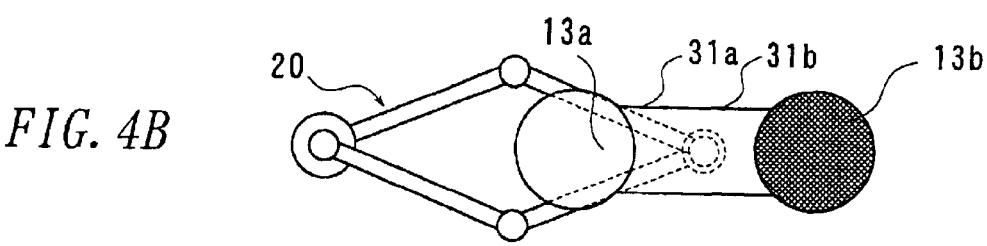
Figure 4C:
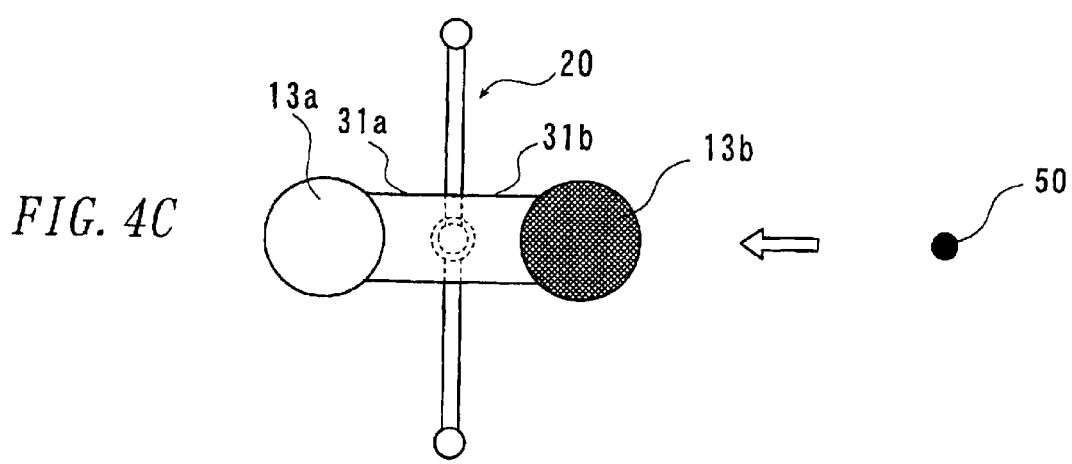

Next, as shown in FIG. 4B, the arm 20 is extended to move the second carrier 31b to a wafer exchange position 50 and as shown in FIG. 4C, the arm 20 is returned to the initial position carrying the treated semiconductor wafer 13b on the second carrier 31b In this condition, the semiconductor wafers 13, 13a are mounted on the first and second carriers 31a, 31b.

Figure 4D:
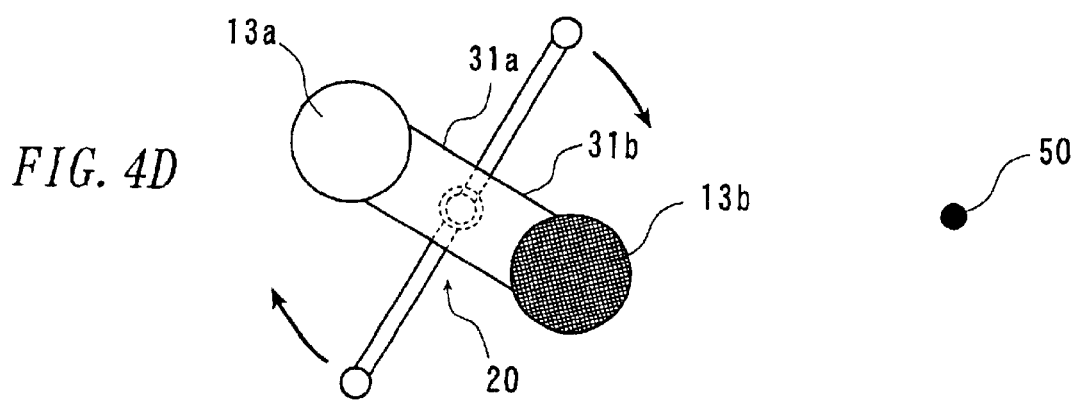
Figure 5A:
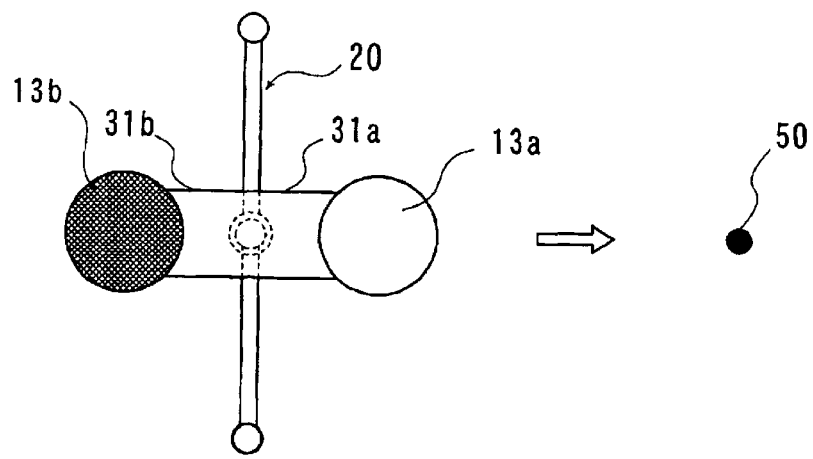
FIGS. 5A through 5C are schematic illustrations of an operation of replacing a treated semiconductor wafer with an untreated semiconductor wafer in a vacuum processing vessel by using the embodiment of FIG. 2 (Part 2).

Then, referring to FIG. 4D and FIG. 5A, the arm 20 is rotated by 180 degrees, pointing the first carrier 31a to the wafer exchange position 50, and the arm 20 is extended to move the first carrier 31a to the wafer exchange position 50.

Figure 5B:
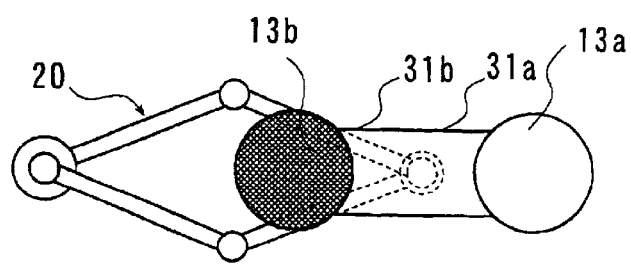
Figure 5C:
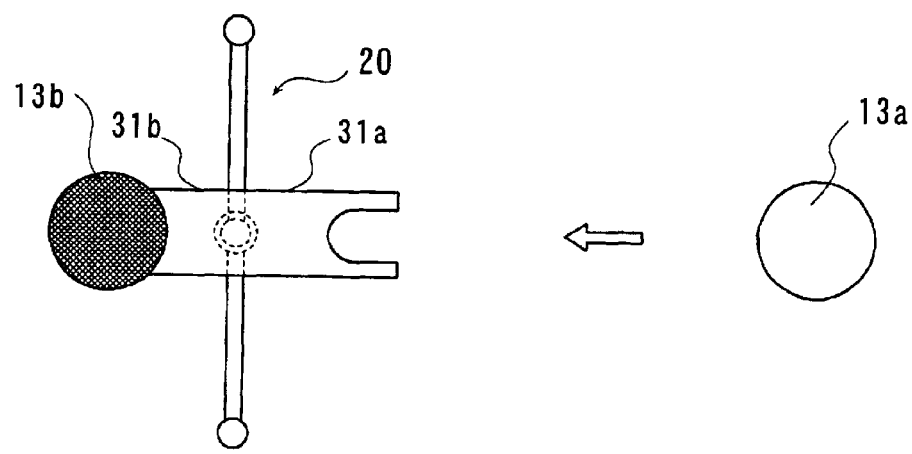

After that, as shown in FIG. 5B, after the untreated semiconductor wafer 13a has been left in the wafer exchange position 50, the first carrier 31a is returned to the initial position as shown in FIG. 5C.

As described above, the configuration of the embodiment according to the first embodiment of this invention makes the minimum turning radius provided when the first to fourth arms 21–24 are located at the dead point smaller than that attained by the prior art, because the drive shafts 11, 12 of the first and second arms 21, 22 are arranged coaxially.

Further, in the present invention, since the spindles 33a, 34a in the ends of the third and fourth arms 23, 24 are also arranged coaxially, the rotary force of the drive shafts 11, 12 can be transmitted to the third and fourth arms 23, 24 without employing a complex correction mechanism for changing arm length. As a result, it becomes possible to move fast the first to fourth arms 21–24 with a simple configuration.

Yet further, in the present invention, since the spindles 33a, 34a on the ends of the third and fourth arms 23, 24 are provided with the rotary forces with opposite phases, it becomes possible to move the carrier 31 attached to the holder 30 of the articulating mechanism 3 straight along the given transport line L, with no rotation and to move the carrier 31 smoothly at the dead point and its vicinity.

Figure 6:
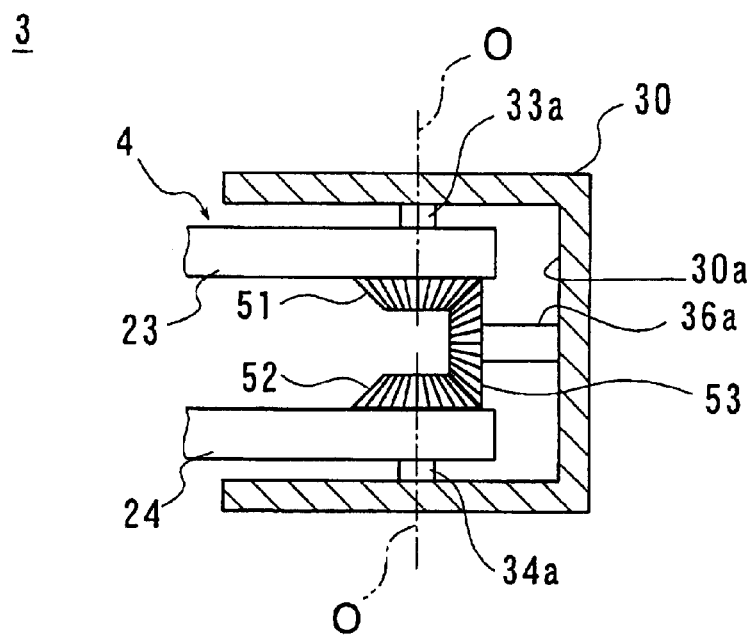
FIG. 6 is a cross sectional view of an alternative attitude control mechanism that can be used for the embodiment of FIG. 2.

FIG. 6 is a sectional view of another example of the attitude control mechanism according to the present invention.

Referring to FIG. 6, in this embodiment, a first bevel gear 51 is fixed to the end of the third arm 23 on the opposite side of its end connected to the first arm 21, and this first bevel gear 51 can rotate around the spindle 33a which is installed on, for example, the upper part of the holder 30. The third arm 23 is rotated in parallel to the plane including transport line L by the first bevel gear 51.

A second bevel gear 52 is fixed to the end of the fourth arm 24 on the opposite side of its end connected to the second arm 22, and this second bevel gear 52 can rotate around the spindle 34a which is installed on, for example, the lower part of the holder 30. The fourth arm 24 is rotated in parallel to the plane including transport line L by the second bevel gear 52.

These first and second bevel gears 51, 52 are arranged coaxially sharing the same rotation axis O.

Further, a third bevel gear 53, which can rotate around the spindle 36a installed orthogonal to the spindles 33a, 34a, is installed on, for example, the inner wall 30a of the holder 30. This third bevel gear 53 engates with the above-mentioned first and second bevel gears 51, 52.

This configuration provides rotary forces with opposite phases to the third and fourth arms 23, 24.

In the present embodiment, the holder 30 of the articulating mechanism 3 does not rotate around the spindles 33a, 34a. Thus the carrier 31 attached to the holder 30 of the articulating mechanism 3 can precisely move straight on transport line L.

Figure 7:
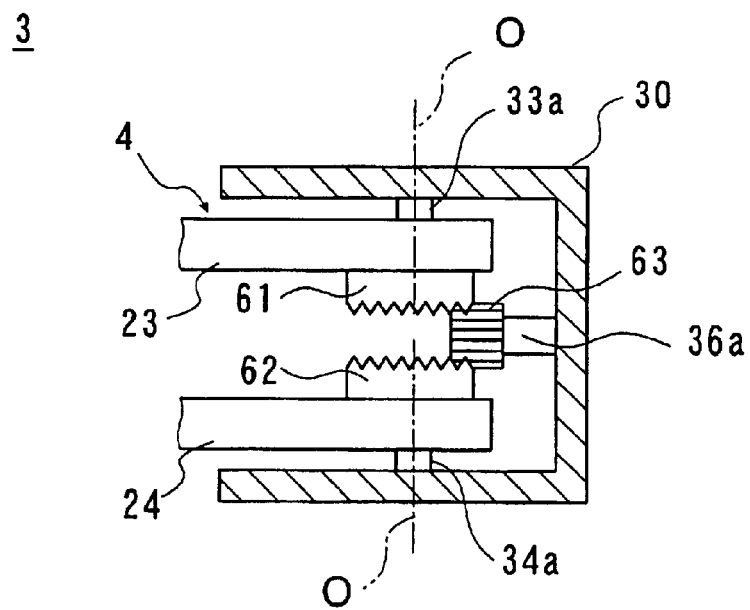
FIG. 7 is a cross sectional view of another alternative attitude control mechanism that can be used for the embodiment of FIG. 2.

FIG. 7 is a sectional view of another example of the attitude control mechanism according to the present invention.

Referring to FIG. 7, in this embodiment, first and second crown gears 61, 62 and a pinion gear 63 are used in combination instead of the bevel gears 51–53 shown in FIG. 6 so that the third arm 23 and the fourth arm 24 are provided with rotary forces with opposite phases.

In the present embodiment as well, the holder 30 of the articulating mechanism 3 does not rotate around the spindles 33a, 34a. Thus, the carrier 31 attached to the holder 30 of the articulating mechanism 3 can precisely move straight on transport line L.

Figure 8A:
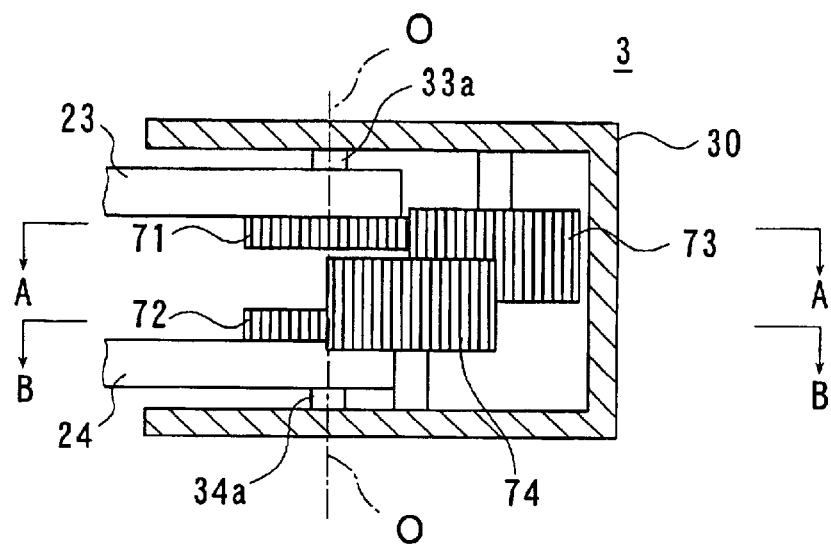
FIGS. 8A through 8C are cross sectional views of still another alternative attitude control mechanism that can be used for the embodiment of FIG. 2.
Figure 8B:
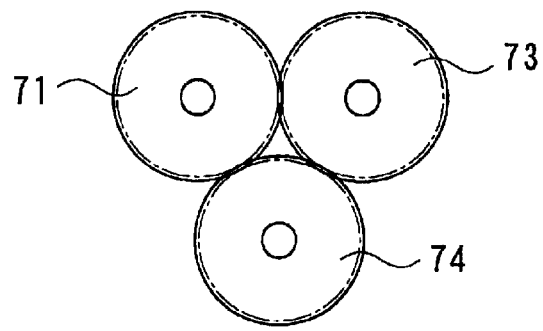
Figure 8C:
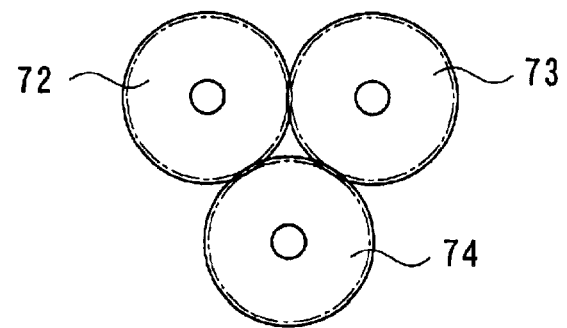

FIGS. 8A–8C are sectional views of another example of the attitude control mechanism according to the present invention.

Referring to FIGS. 8A–8C, a first spur gear 71 is fixed to the end of the third arm 23 on the opposite side of its end connected to the first arm 21, and this first spur gear 71 can rotate around the spindle 33a which is installed on, for example, the upper part of the holder 30. The third arm 23 is rotated in parallel to the plane including transport line L by the first spur gear 71.

A second spur gear 72 is fixed to the end of the fourth arm 24 on the opposite side of its end connected to the second arm 22, and this second spur gear 72 can rotate around the spindle 34a which is installed on, for example, the lower part of the holder 30. The fourth arm 24 is rotated in parallel to the plane including transport line L by the second spur gear 72.

These first and second spur gears 71, 72 are coaxially arranged sharing the same rotation axis O.

Further, a third spur gear 73 that goes into engagement with the first spur gear 71 is installed on the upper part of the holder 30, while a fourth spur gear 74 that goes into engagement with the second spur gear 72 and the third spur gear 73 is installed on the lower part of the holder 30.

The engagement of these first to fourth spur gears 71–74 provides rotary forces with opposite phases to the third and fourth arms 23, 24.

In the present embodiment as well, the holder 30 of the articulating mechanism 3 does not rotate around the spindles 33a, 34a. Thus the carrier 31 attached to the holder 30 of the articulating mechanism 3 can move straight precisely on transport line L.

Figure 9:
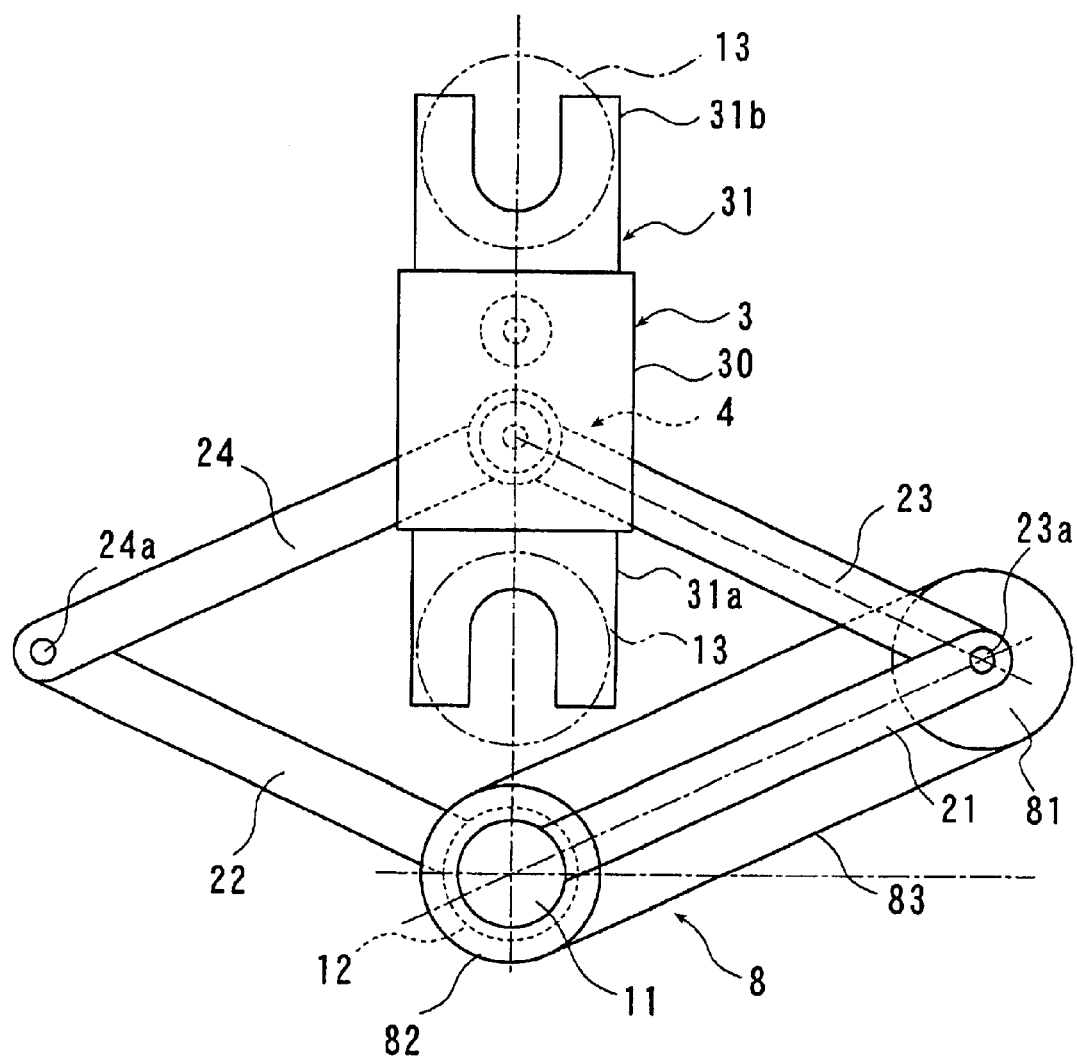
FIG. 9 is a plan view of another embodiment of the transport apparatus according to the invention.

FIG. 9 is a plan view illustrating the configuration of another embodiment of the transport apparatus according to the present invention. In the description that follows, the common parts are denoted by the same reference numerals and their detailed explanation is not repeated.

Referring now to FIG. 9, the transport apparatus of the present embodiment has a separate power transmission mechanism 8 in the second and third arms 22, 23.

In other words, a first pulley 81 is coaxially fixed to the spindle 23a of the third arm 23, while a second pulley 82 is coaxially fixed to the drive shaft 12 of the second arm 22. The diameter of the second pulley 82 is the same as that of the first pulley 81.

These first and second pulleys 81, 82 are wound by a drive belt 83 and this drive belt 83 is fixed by a screw (not shown) on the first and second pulleys 81, 82.

The power transmission mechanism 8 of this configuration provides the third arm 23 in the same phase with the rotary force of the second drive shaft 12 for driving the second arm 22.

In the present embodiment, in addition to the effects described in the previous embodiments, a smoother and more quick operation becomes possible because the power of the driving sources M1, M2 is efficiently transmitted to the arms 21–24 by the power transmission mechanism 8. The other structures and effects, which are all the same as those described in the previous embodiments, are not explained again here.

Figure 10:
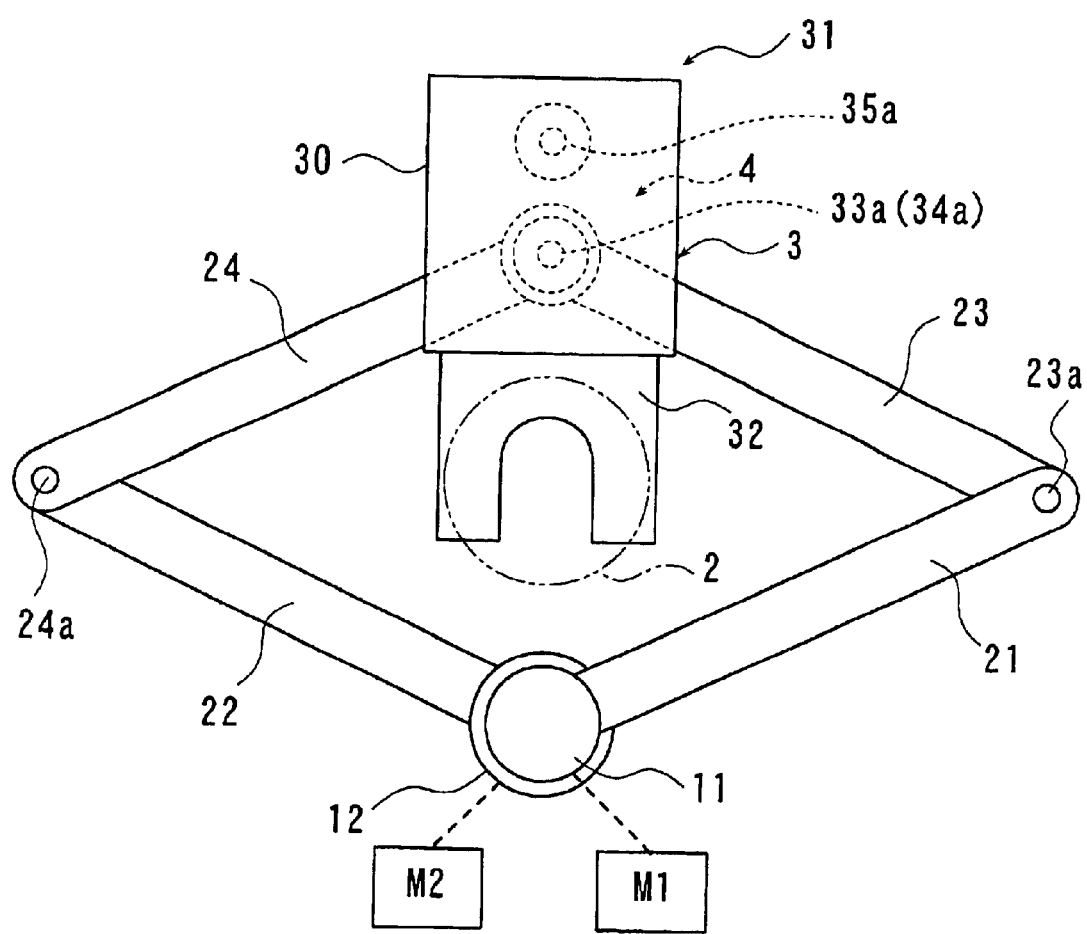
FIG. 10 is a plan view of still another embodiment of the transport apparatus according to the invention.

FIG. 10 illustrates the configuration of another embodiment of the present invention. In the above embodiment, the first and second carriers 31a, 31b carry two semiconductor wafers 13 at the same time. This invention, however, is applicable to transport apparatuses that carry one semiconductor wafer.

As shown in FIG. 10, in the present embodiment, the carrier 32 may be attached to one side in the direction of the movement of the holder 30, and this carrier 32 can carry a single semiconductor wafer 13.

In this case, the carrier 32 may be attached to front side or back side in the direction of the movement of the holder 30.

However, for use in multi-chamber systems, the carrier 32 may be provided to the front side relative to the moving direction of the holder 30, so that the moving distance becomes short.

According to the present embodiment of such configuration, it is possible to make the minimum turning radius smaller than that of the prior art when the first to fourth arms 21–24 are located in the dead point as the case of the above embodiment.

In particular, this embodiment is effective to downsize the transport apparatus because it can make the turning radius of the carrier 32 small. The other configurations and resulting effects are not repeated here because they are the same as those described so far.

It will be apparent to a person skilled in the art that various modifications to the details of construction shown and described may be made without departing from the spirits of this invention.

For example, it is possible to use sprocket wheels and chains instead of the pulleys and belts used in the above-mentioned attitude control mechanism.

Figure 11:
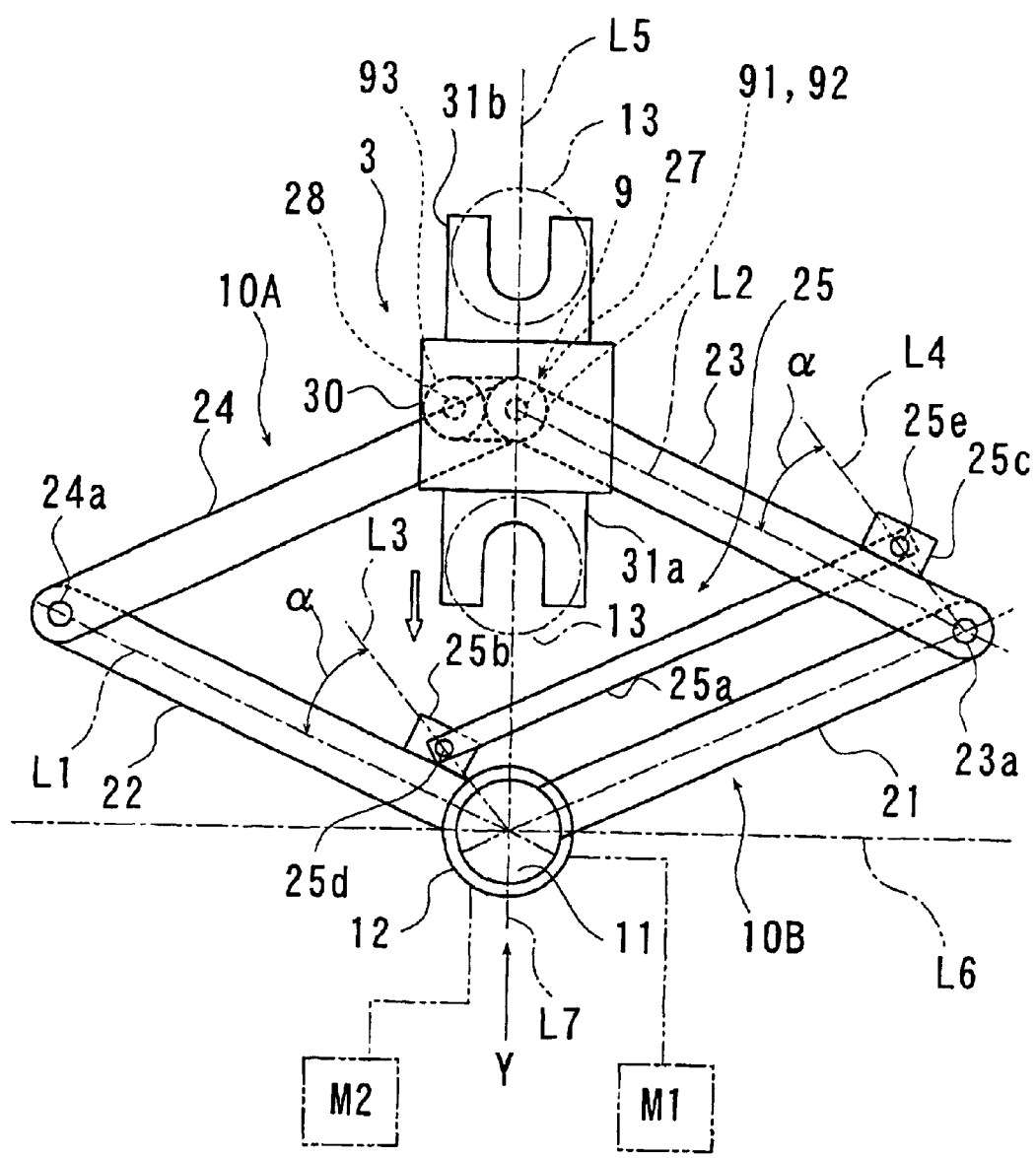
FIG. 11 is a plan view of an embodiment of a transport apparatus according to the second the invention, illustrating its configuration.
Figure 12:
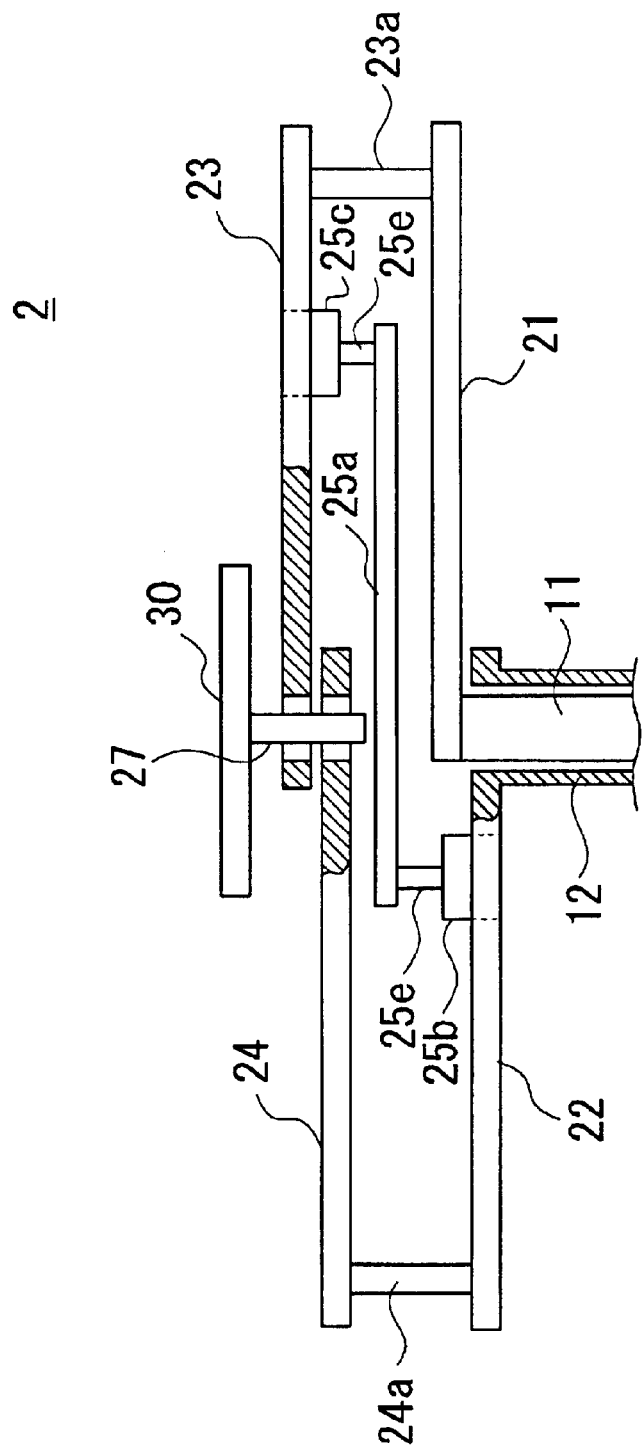
FIG. 12 is a side view of the embodiment of the transport apparatus of FIG. 11 as viewed in the direction of allow Y in FIG. 11.

FIG. 11 is a plan view illustrating the preferred structure of a transport apparatus of another embodiment according to the second embodiment of this invention. FIG. 12 is a side view illustrating the schematic structure of the transport apparatus, seen from direction Y in FIG. 11. Hereafter, the common parts to the first embodiment of this invention are denoted by the same reference numerals and detailed explanations thereof is not repeated.

Referring now to FIG. 11 and FIG. 12, the transport apparatus 2 according to the present invention has a first drive shaft 11 and a second drive shaft 12 which are coaxially arranged. These drive shafts 11, 12 rotate in the clockwise and counterclockwise directions, being driven by two independent driving sources M1, M2 respectively.

A first arm 21 is fixed to the first drive shaft 11, while a second arm 22 is fixed to the second drive shaft 12.

Third and fourth arms (a pair of driven arms) 23, 24 are mounted at the ends of the first and second arms (a pair of driving arms) 21, 22 with bearings(not shown), for example, so that the third and fourth arms 23, 24 can smoothly rotate around spindles 23a, 24a.

These third and fourth arms 23, 24 are coupled to each other at their ends so that their ends can smoothly rotate around a spindle 27 that will be described later.

These first to fourth arms 21–24 are made of a aluminum alloy or the like of which linear expansion coefficient lies in between $23 \times 10^{-6}$ and $24 \times 10^{-6}[/°$ C.] and have the same length(length between the Joints), providing a first parallel link mechanism 10A.

In the case of the present embodiment, a dead point escape mechanism 25 is installed in either of the first and second arms 21, 22, for example, the second arm 22, and in either of the third and fourth arms 23, 24, for example, the third arm 23.

This dead point escape mechanism 25 has a link member 25a, a first link receiver 25b and a second link receiver 25c. The link member 25a is made of the same material as that used in the first to fourth arms 21, 22, 23 and 24, and is the same as those arms in length. The first link receiver 25b is fixed in a predetermined position of the second arm 22 so as to protrude from the second arm 22 toward the third arm 23. The second link receiver 25c is fixed in a predetermined position of the third arm 23 protruding in the same direction as the first link receiver 25b.

The link member 25a is supported at its ends by a first pin 25d and a second pin 25e which are mounted in the first link receiver 25b and the second link receiver 25c, respectively.

The first pin 25d is located on straight line L3 inclined clockwise by a mounting angle a relative to the centerline L1 on the second arm 22 extending from the center of the second drive shaft 12 to the spindle 24a. At the same time, the first pin 25d is arranged at a position spaced apart by a length corresponding to a mounting length ratio from the second drive shaft 12.

Meanwhile, the second pin 25e is located on straight line L4 inclined clockwise by a mounting angle α relative to the centerline L2 on the third arm 23 extending from the center of the spindle 23a to the spindle 27. At the same time, the second pin 25e is arranged at a position spaced apart by a length corresponding to the same mounting length ratio from the spindle 23a.

In this way the first and second pins 25d, 25e make the distance between the joints of the link member 25a the same as the length of the arm of the first parallel link mechanism 10A. The link member 25a along with the first arm 21 constitutes a second parallel link 10B via the first pin 25d on the second arm 22 and the second pin 25e on the third arm 23.

In the case of the present embodiment, the mounting angle α and the mounting length ratio should be within the ±20–40 degrees range for α and within $\frac{1}{5}$–$\frac{1}{3}$ of the mounting length ratio, from the viewpoint such as the required torque for the driving sources M1, M2.

The appropriate ranges of α and can be provided by a specific numerical analysis, with arm length, arm weight, driving torque of the drive shaft, friction in the spindle and other factors being set as parameters. Unless the positions of the first pin 25d and the second pin 25e are adjusted so that the mounting angle α and mounting length ratio fall within the above ranges, there will be a problem that the torque of the driving sources M1, M2 must be raised.

Figure 13A:
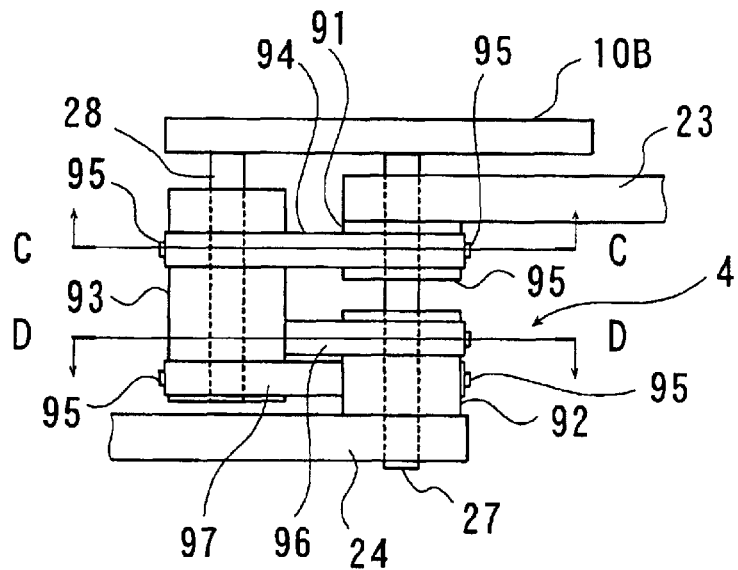
FIG. 13A is a cross sectional side view of an attitude control mechanism of an articulating mechanism of the embodiment of FIG. 12.
Figure 13B:
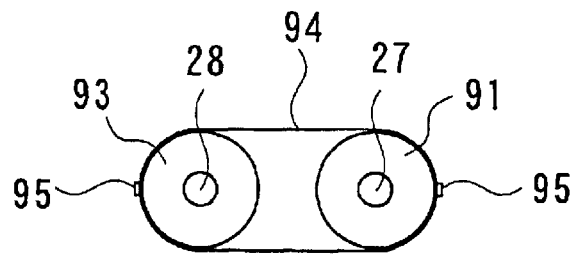
FIG. 13B is a cross sectional view taken along line C—C in FIG. 13A.
Figure 13C:
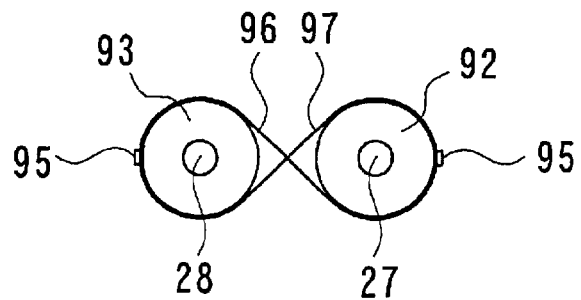
FIG. 13C is a cross sectional view taken along line D—D in FIG. 13A.

FIG. 13A is a side sectional view illustrating the attitude control mechanism of the articulating mechanism according to the present embodiment; FIG. 13B is a sectional view taken along the C—C line in FIG. 13A; and FIG. 13C is a sectional view taken along the D—D line in FIG. 13A.

In the present embodiment, under the holder 30 of the articulating mechanism 3, an attitude control mechanism 9 described below is arranged.

As shown in FIG. 13A, the attitude control mechanism 9 has spindles 27, 28 and first to third cylindrical restraint pulleys 91, 92, and 93.

The spindle 27 is fixed in the position on centerline L5 of the holder 30 and distant equally from the first carrier 31a and the second carrier 31b, supporting the third arm 23 and the fourth arm 24 through their ends. The centerline L5 of the holder 30 connects the centers of the first carrier 31a and the second carrier 31b. Meanwhile, the spindle 28 is fixed in the position in parallel to the spindle 27 so that it is distant from centerline L5 of the holder 30 and is distant equally from the first carrier 31a and the second carrier 31b.

The first restraint pulley 91 is fixed at the end of the third arm 23, where the spindle 27 penetrates. The second restraint pulley 92 is fixed at the end of the fourth arm 24, where the spindle 27 penetrates. The third restraint pulley 93 (rotator) is supported so that it may rotate with no restriction around the spindle 28.

The diameters of those first to third restraint pulleys 91. 92 and 93 are all the same.

Referring to FIGS. 13A and 13B, an endless restraint belt 94 is wound around the first restraint pulley 91 and the third restraint pulley 93. This restraint belt 94 is fixed on the restraint pulleys 91, 93 by a fastening screw 95, for example.

On the other hand, as shown in FIGS. 13A and 13C, a pair of restraint belts 96, 97 are looped across over the second restraint pulley 92 and the third restraint pulley 93. These restraint belts 96, 97 are fixed on the second and third restraint pulleys 92, 93 by a, e.g., fastening screw 95.

The above configuration makes the first restraint pulley 91 and the third restraint pulley 93 rotate in the same direction as much as the same rotation. Meanwhile, the second restraint pulley 92 and the third restraint pulley 93 rotate in the opposite direction as much as the same rotation.

FIG. 14 illustrates the operation of the first parallel link mechanism and the dead point escape mechanism (second parallel link mechanism) according to the present embodiment. In FIG. 14, the second and third link members 22A, 23A are temporarily mounted on both ends of the link member 25a of the second parallel link mechanism 10B for convenience of explanation. Actually, these link members 22A, 23A are replaced by the first link receiver 25b of the second arm 22 and the second link receiver 25c of the third arm 23.

Next, the operation of the present embodiment will be explained in reference to FIG. 11 and FIG. 14.

Figure 14A:
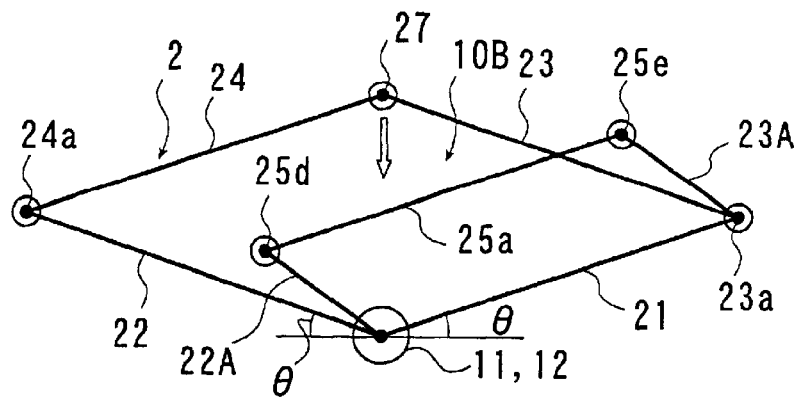
FIGS. 14A through 14D are schematic illustrations of an operation of a first parallel link mechanism and that of a dead point escape mechanism (a second parallel link mechanism) of the embodiment of FIG. 11.

First, as shown in FIG. 14A, when the first drive shaft 11 and the second drive shaft 12 in the first parallel link mechanism 10A are rotated by a predetermined angle θ in the opposite direction so that the angle made by the first arm 21 and the second arm 22 increases toward 180 degrees, which is the angle made when they exist on deadline L6 connecting the dead points at both ends, the first arm 21 and the second arm 22 rotate by the same angle θ in the opposite direction.

Then driven by the first parallel mechanism 10A, as the first and second arms 21, 22 rotate, the third arm 23 rotates by an angle θ around the spindle 27, while the fourth arm 24 rotates by the same angle θ in the opposite direction of the third arm 23 around the spindle 27.

In the attitude control mechanism 9, the third restraint pulley 93 moves in the same direction of the first restraint pulley 91 and in the opposite direction of the second restraint pulley 92 by the same amount of rotation.

In other words, in the attitude control mechanism 9, the movement of the spindle 28 is restricted when the spindle 27 moves along with the rotation of the third arm 23 and the fourth arm 24 so that the spindle 28 moves along centerline L5 connecting the spindle 27 and the center of the holder 30. At the same time, centerline L5 of the holder 30 is aligned on transport line L7 connecting the first and second drive shafts 11, 12 and the spindle 27, which is the bisector of the angle formed by the third arm 23 and the fourth arm 24. Namely, the attitude of the holder 30 is controlled to be symmetric along transport line L7 by aligning it on the same transport line L7.

As a result, the carrier 31 attached to the holder 30 of the articulating mechanism 3 moves straight on transport line L7. When returning the carrier 31 of the holder 30 to the original position, the first drive shaft 11 and the second drive shaft 12 are rotated in the direction opposite to that described above.

Meanwhile, in the second parallel link mechanism 10B (dead point escape mechanism 3), the second link member 22A and the third link member 23A of the link member 25a rotate keeping the mounting angle α against the second arm 22 and the third arm 23, respectively, when the first and second arms 21, 22 rotate.

Hereafter, the operation of the carrier 31 when it passes deadline L6 in the configuration according to the present embodiment is described.

Figure 14B:
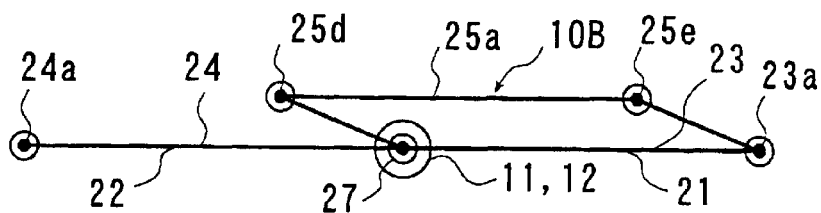
Figure 14C:
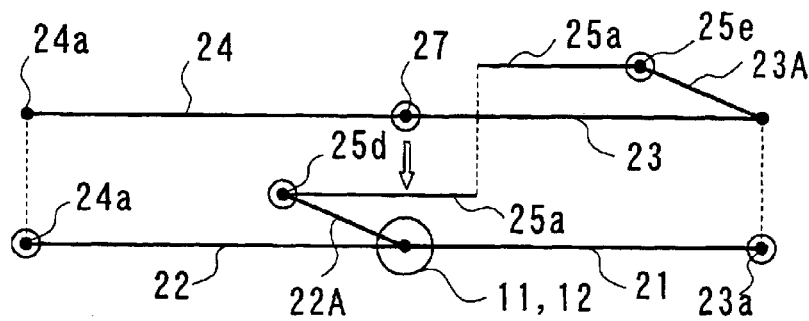

Referring to FIGS. 14B and 14C, when the angle formed by the first arm 21 and the second arm 22 becomes 180 degrees, the angle formed by the third and fourth arms 23, 24 also becomes 180 degrees, controlled by the parallel link mechanism. Then all the first to fourth arms 21, 22, 23 and 24 are aligned on the same straight line.

In this situation, since the holder 30 has no initial velocity and the arm lengths of all first to fourth arms 21, 22, 23 and 24 are equal, the holder 30 cannot move back or forth staying right above the first and second drive shafts 11, 12 even if the first and second drive shafts 11, 12 are rotated in the first parallel link mechanism 10A. In other words, the first arm 21 and the third arm 23 rotate in the same direction and the second arm 22 and the fourth arm 24 rotate in the same direction as well, the holder 30 cannot leave deadline L6.

However, since the second parallel link mechanism 10B is installed with a given tilt angle against the first parallel link mechanism 10A, the rotary force of the second drive shaft 12 is transmitted to the third arm 23 through the second parallel link mechanism 10B.

Figure 14D:
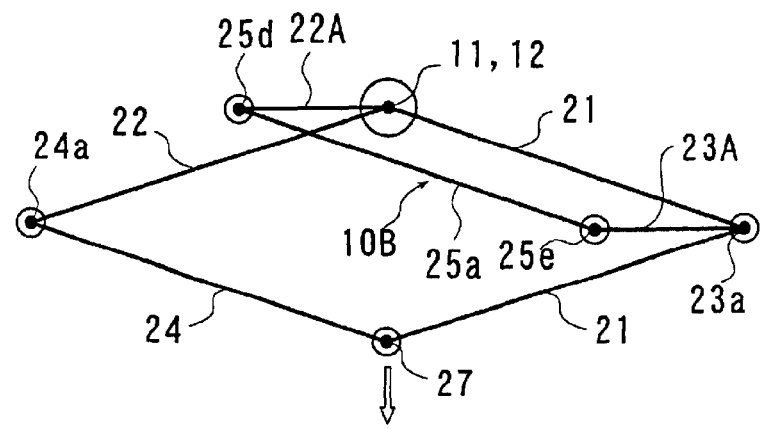

Then, as shown in FIG. 14D, the carrier 31 of the holder 30 passes deadline L6 and proceeds straight forward along transport line L7.

Note that the relationship between the first link mechanism 10A and the second link mechanism 10B situated at the dead point is the same as the above, even if the angle made by the first arm 21 and the second arm 22 becomes zero or 360 degrees and the first to fourth arms 21–24 are all aligned on the same transport line L7. On the other hand, when the second parallel link mechanism 10B reaches the dead point, in other word, when the link member 25a and the first arm 21 are aligned on the same straight line, the movement of the holder 30 is not affected at all, because the first parallel link mechanism 10A is not situated at the dead point.

In the present invention, the operation of replacing a treated semiconductor wafer by an untreated semiconductor wafer in the vacuum processing chamber is as shown in FIGS. 4A–4D and 5A–5C.

Figure 15:
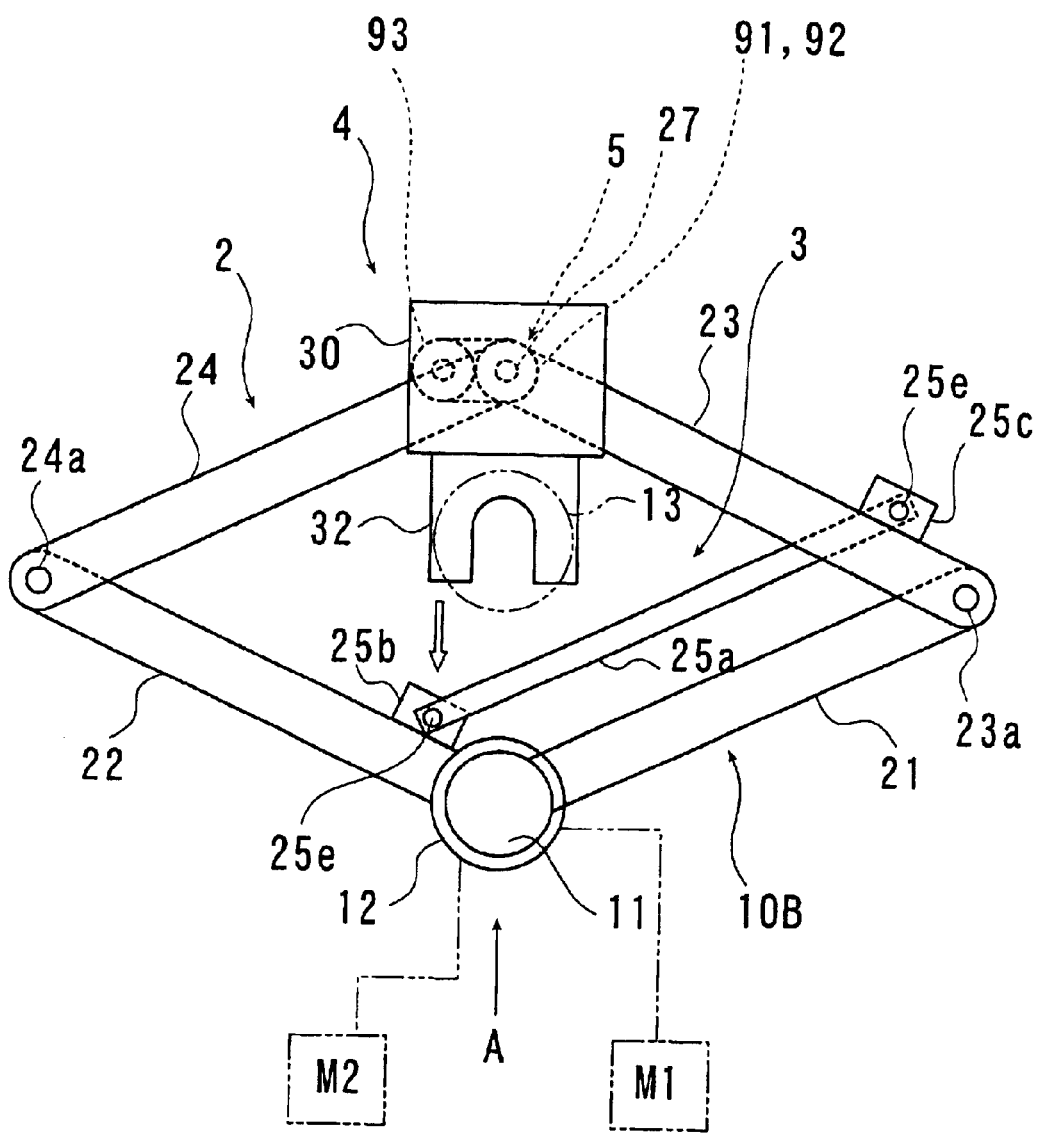
FIG. 15 is a plan view of still another embodiment of the transport apparatus according to the invention.
Figure 16:
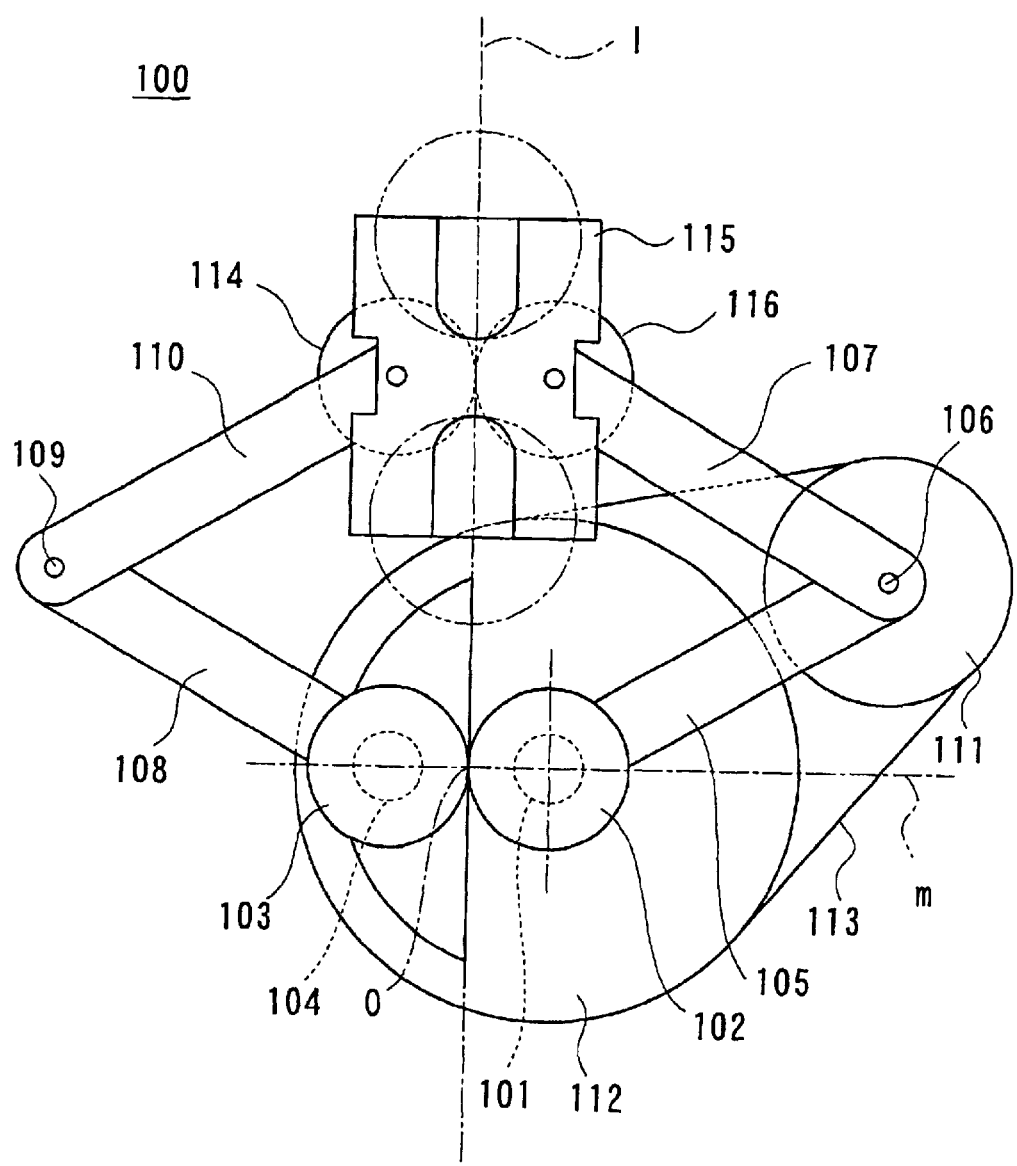
FIG. 16 is a plan view of a known transport apparatus.
Figure 17:
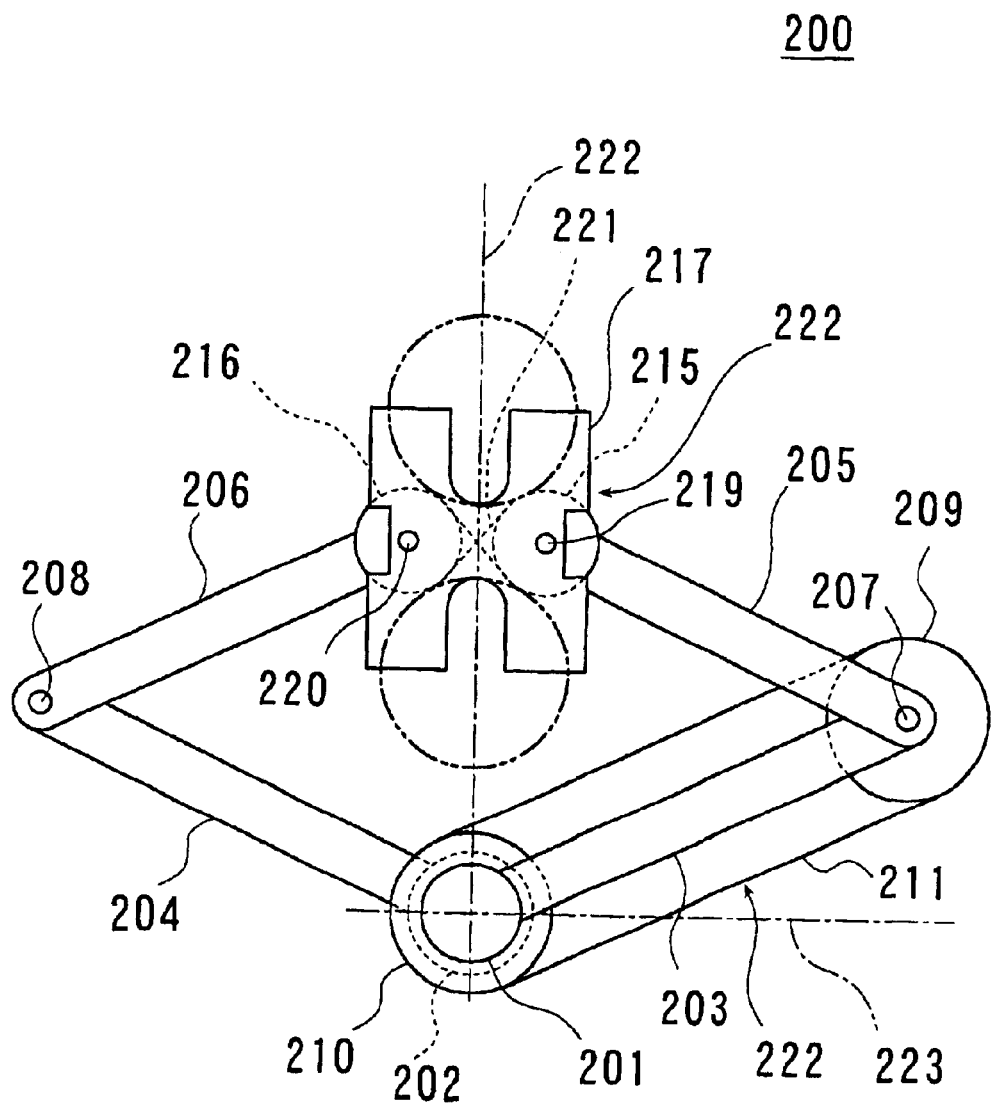
FIG. 17 is a plan view of another known transport apparatus, illustrating main parts thereof.

FIG. 15 illustrates another embodiment of the present invention.

In the aforementioned embodiment, the first and second carriers 31a, 31b carry two semiconductor wafers 13 at the same time. However, it is possible to apply this invention to transport apparatuses that carry a single semiconductor wafer.

In the present embodiment, as shown in FIG. 15, the holder 30 has a carrier 32 on one side in its moving direction and this carrier 32 can accept a single semiconductor wafer 13 thereon.

In this case, the carrier 32 may be installed on either side, front side or back side, along the moving direction of the holder 30. However, for use in multi-chamber systems, it is preferable to install the carrier 32 on the front side of the moving direction of the holder 30, so that the moving distance becomes short.

According to the configuration of the above embodiment, it is possible to provide a transport apparatus that can ensure the straight movement of the substrate with no increase in the number of necessary components or complexity in assembly and adjustment, eliminating the influence of the dead point escape mechanism upon the attitude control mechanism.

In particular, this embodiment is effective to downsize the transport apparatus because it can make the turning radius of the carrier small. The other configurations and resulting effects are not repeated here because they are the same as those described so far.

The invention is not limited only to the above embodiments, and can be modified appropriately.

For examples in the above embodiment, the second parallel link mechanism 10B is installed in the first parallel link mechanism 10A. However, it is possible to make the second parallel link mechanism 10B separate from the first parallel link mechanism 10A, extending the arms from the drive shafts 11, 12, which have been coupled with pins at both ends of the link member 25a in the above embodiment.

This configuration has an advantage in that it is not necessary to take into account the influence of the dimensional change of the link member 25a caused by external forces and heat upon the first parallel link mechanism 10A.

In the above embodiment, the link member 25a is added in between the first, second and third arms 21, 22 and 23 to form the second link mechanism 10B. However, it is possible in this invention to form the second link mechanism 10B by adding the link member 25a in between the first, second and fourth arms 21, 22 and 24.

Further in the above embodiment, the spindle 27 of the attitude control mechanism 9 is positioned on transport line L7. However, the spindles 27, 28 may be positioned symmetrically across centerline L5 of the holder 30. Then the holder 30 can move straight with higher precision, provided that changes in length due to heat are controlled to be uniform.

The restraint belts used in the attitude control mechanism may be replaced by wires.

The transport apparatus according to the present invention may be applied to a variety of apparatuses including vacuum processing systems and modifications, improvements, and combinations can be made with departing from the scope of this invention.

As pointed out above, according to the invention, it is possible to provide a transport apparatus having a simple configuration that can reduce its turning radius and transport semiconductor devices at high speed.

Additionally, according to the invention, it is possible to provide a transport apparatus that can ensure the straight movement of the substrate with no increase in the number of necessary components or complexity in assembly and adjustment, eliminating the influence of the dead point escape mechanism upon the attitude control mechanism.

What is claimed is:

1. A transport apparatus for transporting substrates, the transport apparatus comprising:

first and second arms having at a first end of each thereof a rotary drive shaft, the rotary drive shafts being arranged coaxially;

first and second drive sources for applying rotary forces respectively to the rotary drive shafts of the first and second arms;

third and fourth arms rotatably linked at respective first ends thereof to the respective second ends of the first and second arms, the second ends of the third and fourth arms being rotatably supported around centers of coaxially arranged spindles, respectively; and an articulating mechanism having an attitude control mechanism for applying rotary forces with opposite phases to the respective spindles arranged at the second ends of the third and fourth arms, wherein the attitude control mechanism has a power transmission mechanism for transmitting rotary forces with opposite phases to the respective spindles of the third and fourth arms, and wherein the attitude control mechanism comprises first and second restraint pulleys fixed respectively to the spindles of the third and fourth arms, a third restraint pulley juxtaposed with the first and second restraint pulleys, a first restraint belt wound around the first restraint pulley and the third restraint pulley so as to make them rotate in phase, and a pair of restraint belts wound around the second restraint pulley and the third restraint pulley so as to make them rotate in opposite phases, the pair of restraint belts including second and third restraint belts, and wherein the first restraint belt is connected to the first and third restraint pulleys with fastening screws, and the second and third restraint belts are connected to the second and third restraint pulleys with other fastening screws.

2. The transport apparatus according to claim 1, wherein the first, second, third and fourth arms have an identical length.

3. The transport apparatus according to claim 1, wherein rotary forces with opposite phases applied to the respective spindles of the third and fourth arms are identical in magnitude.

4. The transport apparatus according to claim 1, further comprising: a drive transmission mechanism comprising: a drive pulley fixed to a drive shaft of the first or second arm; a driven pulley fixed to a spindle arranged at an end of the third or fourth arm; and a belt wound around the drive pulley and the driven pulley.

5. The transport apparatus according to claim 1, wherein the rotational axes of the coaxially arranged rotary drive shafts that drive the first and second arms, and the centers of the coaxially arranged spindles around which the third and fourth arms rotate are aligned with a transport line along which the substrates are transported.

6. A vacuum processing system comprising:

a vacuum processing chamber; and a transport apparatus for transporting substrates in a vacuum processing chamber, wherein the transport apparatus comprises first and second arms having at a first end of each thereof a rotary drive shaft, the rotary drive shafts being arranged coaxially;

first and second drive sources for applying rotary forces respectively to rotary drive shafts of the first and second arms;

third and fourth arms rotatably linked at respective first ends thereof to the respective second ends of the first and second arms, the second ends of the third and fourth arms being rotatably supported around a center of coaxially arranged respective spindles; and an articulating mechanism having an attitude control mechanism for applying rotary forces with opposite phases to the respective spindles arranged at the second ends of the third and fourth arms, wherein the attitude control mechanism has a power transmission mechanism for transmitting rotary forces with opposite phases to the respective spindles of the third and fourth arms, and wherein the attitude control mechanism comprises first and second restraint pulleys fixed respectively to the spindles of the third and fourth arms, a third restraint pulley juxtaposed with the first and second restraint pulleys, a first restraint belt wound around the first restraint pulley and the third restraint pulley so as to make them rotate in phase, and a pair of restraint belts wound around the second restraint pulley and the third restraint pulley so as to make them rotate in opposite phases, the pair of restraint belts including second and third restraint belts, and wherein the first restraint belt is connected to the first and third restraint pulleys with fastening screws, and the second and third restraint belts are connected to the second and third restraint pulleys with other fastening screws.

* * * * *